United States Patent
Hebrink

(10) Patent No.: US 9,285,584 B2
(45) Date of Patent: Mar. 15, 2016

(54) ANTI-REFLECTIVE ARTICLES WITH NANOSILICA-BASED COATINGS AND BARRIER LAYER

(75) Inventor: Timothy J. Hebrink, Scandia, MN (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 347 days.

(21) Appl. No.: 13/825,403

(22) PCT Filed: Sep. 30, 2011

(86) PCT No.: PCT/US2011/054200
§ 371 (c)(1),
(2), (4) Date: Mar. 21, 2013

(87) PCT Pub. No.: WO2012/047749
PCT Pub. Date: Apr. 12, 2012

(65) Prior Publication Data
US 2013/0182331 A1    Jul. 18, 2013

Related U.S. Application Data

(60) Provisional application No. 61/390,530, filed on Oct. 6, 2010.

(51) Int. Cl.
| | |
|---|---|
| *G02B 27/00* | (2006.01) |
| *B82Y 20/00* | (2011.01) |
| *B82Y 30/00* | (2011.01) |
| *B82Y 40/00* | (2011.01) |

(Continued)

(52) U.S. Cl.
CPC ............ *G02B 27/0006* (2013.01); *B82Y 20/00* (2013.01); *B82Y 30/00* (2013.01); *B82Y 40/00* (2013.01); *C23C 24/08* (2013.01); *G02B 1/113* (2013.01); *G02B 5/0294* (2013.01); *H01L 31/0203* (2013.01); *H01L 31/0236* (2013.01); *H01L 31/02168* (2013.01); *H01L 31/02366* (2013.01); *H01L 31/0481* (2013.01); *G02B 2207/101* (2013.01); *G02B 2207/107* (2013.01); *Y02E 10/50* (2013.01)

(58) Field of Classification Search
None
See application file for complete search history.

(56) References Cited

U.S. PATENT DOCUMENTS

| | | |
|---|---|---|
| 3,301,741 A | 1/1967 | Henrickson |
| 3,354,022 A | 11/1967 | Dettre |

(Continued)

FOREIGN PATENT DOCUMENTS

| | | |
|---|---|---|
| CN | 101271931 | 9/2008 |
| EP | 0145308 | 6/1985 |

(Continued)

OTHER PUBLICATIONS

The State Intellectual Property Office of the People's Republic of China, Second Office Action for Application No. 201180047583.8, dated Oct. 16, 2014 (12 pages).

(Continued)

*Primary Examiner* — Arnel C Lavarias
(74) *Attorney, Agent, or Firm* — Gregory D. Allen

(57) ABSTRACT

An article including a transparent substrate having an anti-reflective, structured surface and a sintered coating including a porous network of silica nanoparticles thereon, wherein the silica nanoparticles are bonded to adjacent silica nanoparticles, wherein the structured substrate further includes a backing face, and a moisture barrier layer bonded to the backing face of the structured substrate.

12 Claims, 5 Drawing Sheets

(51) Int. Cl.
*C23C 24/08* (2006.01)
*G02B 1/113* (2015.01)
*G02B 5/02* (2006.01)
*H01L 31/0203* (2014.01)
*H01L 31/0216* (2014.01)
*H01L 31/0236* (2006.01)
*H01L 31/048* (2014.01)

(56) References Cited

U.S. PATENT DOCUMENTS

| | | |
|---|---|---|
| 3,931,428 A | 1/1976 | Reick |
| 4,229,066 A | 10/1980 | Rancourt |
| 4,590,117 A | 5/1986 | Taniguchi |
| 4,683,160 A | 7/1987 | Bloch |
| 4,696,719 A | 9/1987 | Bischoff |
| 4,722,515 A | 2/1988 | Ham |
| 4,842,893 A | 6/1989 | Yializis |
| 4,916,169 A | 4/1990 | Boardman |
| 4,944,514 A | 7/1990 | Suiter |
| 4,954,371 A | 9/1990 | Yializis |
| 4,986,496 A | 1/1991 | Marentic |
| 5,018,048 A | 5/1991 | Shaw |
| 5,032,461 A | 7/1991 | Shaw |
| 5,069,403 A | 12/1991 | Marentic |
| 5,073,404 A | 12/1991 | Huang |
| 5,097,800 A | 3/1992 | Shaw |
| 5,125,138 A | 6/1992 | Shaw |
| 5,133,516 A | 7/1992 | Marentic |
| 5,145,886 A | 9/1992 | Oxman |
| 5,175,030 A | 12/1992 | Lu |
| 5,217,805 A | 6/1993 | Kessel |
| 5,221,497 A | 6/1993 | Watanabe |
| 5,233,465 A | 8/1993 | Wheatley |
| 5,378,535 A | 1/1995 | Moncur |
| 5,435,816 A | 7/1995 | Spurgeon |
| 5,440,446 A | 8/1995 | Shaw |
| 5,449,413 A | 9/1995 | Beauchamp |
| 5,464,667 A | 11/1995 | Kohler |
| 5,480,596 A | 1/1996 | Okubo |
| 5,504,134 A | 4/1996 | Palmer |
| 5,547,908 A | 8/1996 | Furuzawa |
| 5,667,595 A | 9/1997 | Vaverka |
| 5,858,468 A | 1/1999 | Byrd |
| 5,876,688 A | 3/1999 | Laundon |
| 5,972,809 A | 10/1999 | Faler |
| 6,040,053 A | 3/2000 | Scholz |
| 6,045,864 A | 4/2000 | Lyons |
| 6,046,250 A | 4/2000 | Boardman |
| 6,049,419 A | 4/2000 | Wheatley |
| 6,117,555 A | 9/2000 | Fujimori |
| 6,132,861 A | 10/2000 | Kang |
| 6,180,181 B1 | 1/2001 | Verardi |
| 6,214,422 B1 | 4/2001 | Yializis |
| 6,231,939 B1 | 5/2001 | Shaw |
| 6,244,740 B1 | 6/2001 | Wagner |
| 6,251,523 B1 | 6/2001 | Takahashi |
| 6,348,237 B2 | 2/2002 | Kohler |
| 6,376,569 B1 | 4/2002 | Oxman |
| 6,391,141 B2 | 5/2002 | Boaz |
| 6,449,093 B2 | 9/2002 | Hebrink |
| 6,480,596 B1 | 11/2002 | Min |
| 6,495,624 B1 | 12/2002 | Brown |
| 6,511,701 B1 | 1/2003 | Divigalpitiya |
| 6,573,328 B2 | 6/2003 | Kropp |
| 6,730,397 B2 | 5/2004 | Melancon |
| 6,744,561 B2 | 6/2004 | Condo |
| 6,783,349 B2 | 8/2004 | Neavin |
| 6,800,354 B2 | 10/2004 | Baumann |
| 6,926,952 B1 | 8/2005 | Weber |
| 6,929,849 B2 | 8/2005 | Koskenmaki |
| 7,015,640 B2 | 3/2006 | Schaepkens |
| 7,018,713 B2 | 3/2006 | Padiyath |
| 7,019,905 B2 | 3/2006 | Weber |
| 7,070,850 B2 | 7/2006 | Dietz |
| 7,074,463 B2 * | 7/2006 | Jones et al. ................ 428/1.1 |
| 7,141,297 B2 | 11/2006 | Condo |
| 7,215,473 B2 | 5/2007 | Fleming |
| 7,368,655 B2 | 5/2008 | Blieske |
| 7,486,019 B2 | 2/2009 | Padiyath |
| 7,575,655 B2 | 8/2009 | Kuhn |
| 8,354,160 B2 | 1/2013 | Jing |
| 2001/0051213 A1 | 12/2001 | Schulz |
| 2002/0045045 A1 | 4/2002 | Adams |
| 2002/0129850 A1 | 9/2002 | Nomura |
| 2003/0013795 A1 | 1/2003 | Nun |
| 2003/0077437 A1 * | 4/2003 | Nakamura et al. ............ 428/327 |
| 2004/0068035 A1 | 4/2004 | Paiva |
| 2004/0248995 A1 | 12/2004 | Glaubitt |
| 2005/0178428 A1 | 8/2005 | Laaly |
| 2005/0223945 A1 | 10/2005 | Baumgart |
| 2006/0062937 A1 | 3/2006 | Padiyath |
| 2006/0084780 A1 | 4/2006 | Hebrink |
| 2006/0204655 A1 | 9/2006 | Takahashi |
| 2006/0225776 A1 | 10/2006 | Nemazi |
| 2006/0234605 A1 | 10/2006 | Bryan |
| 2007/0020451 A1 | 1/2007 | Padiyath |
| 2007/0065638 A1 | 3/2007 | Wang |
| 2007/0074757 A1 | 4/2007 | Mellott |
| 2007/0257400 A1 | 11/2007 | Stenzel |
| 2007/0292623 A1 | 12/2007 | Lin |
| 2008/0135091 A1 | 6/2008 | Cheng |
| 2008/0196664 A1 | 8/2008 | David |
| 2009/0220774 A1 * | 9/2009 | Imai et al. ................ 428/331 |
| 2009/0246415 A1 | 10/2009 | Horie |
| 2009/0283133 A1 | 11/2009 | Hebrink |
| 2009/0283144 A1 | 11/2009 | Hebrink |
| 2010/0051093 A1 | 3/2010 | Harder |
| 2010/0151239 A1 | 6/2010 | Hebert |
| 2010/0173167 A1 | 7/2010 | Vissing |
| 2010/0180928 A1 | 7/2010 | Raymond |
| 2010/0266836 A1 | 10/2010 | Campazzi |
| 2010/0326501 A1 * | 12/2010 | Zhao et al. ................ 136/252 |
| 2011/0033694 A1 | 2/2011 | Jing |
| 2011/0111203 A1 | 5/2011 | Roemer-Scheuermann |
| 2011/0206923 A1 | 8/2011 | Liu |
| 2011/0206924 A1 | 8/2011 | Liu |
| 2011/0223434 A1 | 9/2011 | Roehrig |
| 2011/0281078 A1 | 11/2011 | Schiavoni |
| 2012/0018482 A1 | 1/2012 | Pepin |
| 2012/0199198 A1 | 8/2012 | Hebrink |
| 2012/0276369 A1 | 11/2012 | Jing |
| 2013/0010364 A1 | 1/2013 | Hebrink |
| 2013/0040073 A1 | 2/2013 | Pett |
| 2013/0040126 A1 | 2/2013 | Pett |
| 2013/0142994 A1 * | 6/2013 | Wang et al. ................ 428/141 |
| 2013/0182331 A1 * | 7/2013 | Hebrink ................ 359/601 |
| 2013/0186466 A1 * | 7/2013 | Hebrink et al. ................ 136/256 |
| 2013/0295327 A1 * | 11/2013 | Zhang et al. ................ 428/141 |

FOREIGN PATENT DOCUMENTS

| | | |
|---|---|---|
| EP | 0263428 | 4/1988 |
| EP | 0424006 | 4/1991 |
| EP | 0570165 | 11/1993 |
| EP | 0834468 | 4/1998 |
| EP | 0989443 | 3/2000 |
| EP | 1132448 | 9/2001 |
| EP | 1189288 | 3/2002 |
| EP | 1362682 | 11/2003 |
| EP | 1486802 | 12/2004 |
| EP | 1690602 | 8/2006 |
| GB | 1454960 | 11/1976 |
| GB | 2041956 | 9/1980 |
| GB | 2066565 | 7/1981 |
| GB | 2137648 | 10/1984 |
| GB | 05163463 | 6/1993 |
| JP | H10-133002 | 5/1998 |
| JP | 2002-107501 | 4/2002 |
| JP | 2004-219626 | 8/2004 |
| JP | 2010-153570 | 7/2010 |
| WO | 90/15673 | 12/1990 |
| WO | 97/31357 | 8/1997 |
| WO | 00/26973 | 5/2000 |

(56) References Cited

FOREIGN PATENT DOCUMENTS

| WO | 01/68940 | 9/2001 |
|---|---|---|
| WO | 03/033423 | 4/2003 |
| WO | 2007/015273 | 2/2007 |
| WO | 2008/022027 | 2/2008 |
| WO | 2009/029435 | 3/2009 |
| WO | 2009/046725 | 4/2009 |
| WO | 2009/120983 | 10/2009 |
| WO | 2009/141830 | 11/2009 |
| WO | 2010/017069 | 2/2010 |
| WO | 2010/056541 | 5/2010 |
| WO | 2010/056543 | 5/2010 |
| WO | 2010/056546 | 5/2010 |
| WO | 2010/056559 | 5/2010 |
| WO | 2010/120570 | 10/2010 |
| WO | 2011/056496 | 5/2011 |
| WO | 2011/062836 | 5/2011 |
| WO | 2011/081974 | 7/2011 |
| WO | 2012/047422 | 4/2012 |
| WO | 2012/078452 | 6/2012 |
| WO | 2012/087663 | 6/2012 |

OTHER PUBLICATIONS

Affinito, "Vacuum deposited polymer/metal multilayer films for optical application", Thin Solid Films, Dec. 1995, vol. 270, Nos. 1-2, pp. 43-48.
Affinito, "Polymer-Oxide Transparent Barrier Layers", Society of Vacuum Coaters, 39th Annual Technical Conference Proceedings, 1996, pp. 392-397.
Biederman, "Plasma Polymerization Processes," Elsevier, New York (1992), 5 pages.
Bragg, "The Form Birefringence of Macromolecules", Acta. Cryst., 1953, vol. 6, pp. 865-867.
Brook, "Silicon in Organic, Organometallic, and Polymer Chemistry", John Wiley & Sons, Inc., New York (2000), p. 297, 18 pages.
D'Agostino, "Plasma Deposition, Treatment, and Etching of Polymers," Academic Press Inc., San Diego (1990), 5 pages.
Dolle, "Gradual Photochemical-Induced Conversion of Liquid Polydimethylsiloxane Layers to Carbon Containing Silica Coatings by VUV Irradiation at 172 nm", Langmuir, 2009, vol. 25, No. 12, pp. 7129-7134.
Frounchi, "Comparison Between Electron-Beam and Chemical Crosslinking of Silicone Rubber", Nuclear Instruments and Methods in Physics Research B, Feb. 2006, vol. 243, No. 2, pp. 354-358.
Mark, "Physical Properties of Polymers Handbook", Second Edition, Springer Science + Business Media, LLC, New York (2007), p. 882, 8 pages.
Scheydecker, "Reduction of Reflection Losses of PV-Modules by Structured Surfaces", Solar Energy, Aug. 1994, vol. 53, No. 2, pp. 171-176.
Shaw, "A New Vapor Deposition Process for Coating Paper and Polymer Webs", Technical paper presented at the Sixth International Vacuum Web Coating Conference in Reno, Oct. 28, 1992, pp. 18-24.
Shaw, "A New High Speed Process for Vapor Depositing Acrylate Thin Films: An Update", Society of Vacuum Coaters, 36th Annual Technical Conference Proceedings, Dallas, Texas, Apr. 25-30, 1993, pp. 348-352.
Shaw, "Use of Vapor Deposited Acrylate Coatings to Improve the Barrier Properties of Metallized Film", Society of Vacuum Coaters, 37th Annual Technical Conference Proceedings, 1994, pp. 240-247.
Shaw, "Use of Evaporated Acrylate Coatings to Smooth the Surface of Polyester and Polypropylene Film and Aluminium Foil", RadTech'96 North America UV/EB Conference Proceedings, vol. 2, Nashville, Tennessee, Apr. 28-May 2, 1996, pp. 701-707.
Winter, "Design of Dies for the Extrusion of Sheets and Annular Parisons: The Distribution Problem", Polymer Engineering and Science, Apr. 1986, vol. 26, No. 8, pp. 543-553.
Yasuda, "Plasma Polymerization", Academic Press, Inc., Orlando (1985), 5 pages.
International Search Report for PCT/US2011/054200, 3 pages.

* cited by examiner

500nm

20nm

US 9,285,584 B2

ANTI-REFLECTIVE ARTICLES WITH NANOSILICA-BASED COATINGS AND BARRIER LAYER

This invention was made with Government support under Contract No. DE-EE0000587, awarded by DOE. The Government has certain rights in this invention.

BACKGROUND

Structured surfaces have been used in various applications for optical benefits, surface energy modification, adhesive tack control, and drag reduction. For example, prismatic structures on the surface of photovoltaic panels reduce reflection and direct more light towards the silicon cells, thus increasing power output. Similar prismatic structures promote fluid flow over a surface resulting in reduced drag when applied to an automobile, boat, or the like, or to wind or water turbine blades.

With the rising costs of conventional power generation based on burning fossil fuels (e.g., oil and coal based power plants), and the desire to reduce associated greenhouse gases, investments into non-conventional sources of power have increased. For example, the U.S. Department of Energy has invested heavily into the research and development of solar power generation (e.g., solar energy based hot water and electricity generation). One such non-conventional source of power generation is the use of photovoltaic cells to convert solar light energy into electricity. Solar light energy has also been used to directly or indirectly heat water for residential and commercial use. Along with this increased level of interest, there is a need for improving the efficiency at which such non-conventional solar energy technologies can absorb light energy and thereby increase the amount of solar energy available for use. Therefore, it is desirable for an antireflective surface to be placed between the energy conversion device and the sun to reduce surface reflections and increase transmission. A common problem associated with anti-reflective surfaces is soiling and thus the need for a coating on the anti-reflective surface which reduces or prevents the accumulation of dirt, sand, oil, etc. . . .

SUMMARY

In one aspect, the present disclosure describes an article comprising a transparent substrate (e.g., a film) having an anti-reflective, structured surface and a sintered coating comprising a porous network (typically a three-dimensional network) of silica nanoparticles thereon, wherein the silica nanoparticles are bonded to adjacent silica nanoparticles, wherein the structured substrate further comprises a backing face, and a moisture barrier layer bonded to the backing face of the structured substrate. Referring to FIG. 2 silica nanoparticles 2 that have not been sintered are shown. Referring to FIG. 3 silica nanoparticles 3 that have been acid sintered are shown.

In this application:

"anti-reflective" means a surface that has less than 4% reflection at normal angles;

"sintered" means the bonding of adjacent surfaces of particles;

"structured surface" means any non-planar surface; and

"porous network of silica nanoparticles" refers to the presence of voids between the silica nanoparticles created when the nanoparticles form a continuous coating. Preferably, the network has a porosity of 25 to 45 volume percent, more preferably 30 to 40 volume percent, when dried. In some embodiments the porosity may be higher. Porosity may be calculated from the refractive index of the coating according to published procedures such as in W. L. Bragg, A. B. Pippard, Acta Crystallographica, volume 6, page 865 (1953), the disclosure of which is incorporated herein by reference. Any exemplary three-dimensional, porous network of silica nanoparticles is shown in FIG. 1.

Further, as used herein, the term "transparent" refers to a substrate that allows a desired bandwidth of light transmission therethrough. A substrate can still be transparent, as that term is used herein, without also being considered clear. That is, a substrate can be considered hazy and still be transparent as the term is used herein. It is desirable for a transparent substrate according to the present invention to allow at least 85%, 91%, 92%, 93%, 94%, 95%, 96%, 97%, or 98% light transmission therethrough. Desirable electromagnetic wavelengths of transparency include the visible range (i.e., about 400 nm to about 2500 nm, in some embodiments, preferably about 400 nm to about 1150 nm) and/or the near infrared (IR) range (i.e., about 700 nm to about 2500 nm), although other electromagnetic wavelengths of transparency are also useful.

DETAILED DESCRIPTION

Figure 1:
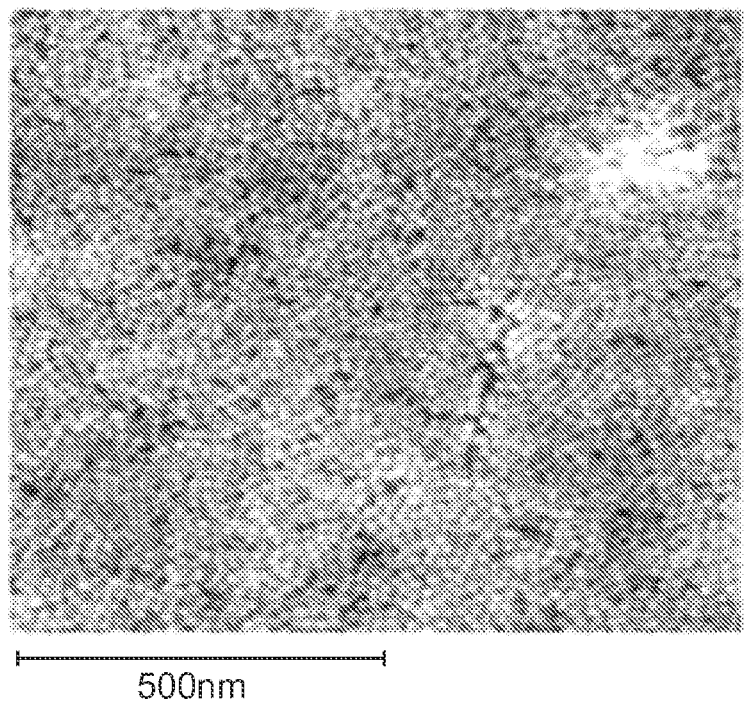
FIG. 1 is a scanning electron photomicrograph of an exemplary three-dimensional, porous network of silica nanoparticles.
Figure 2:
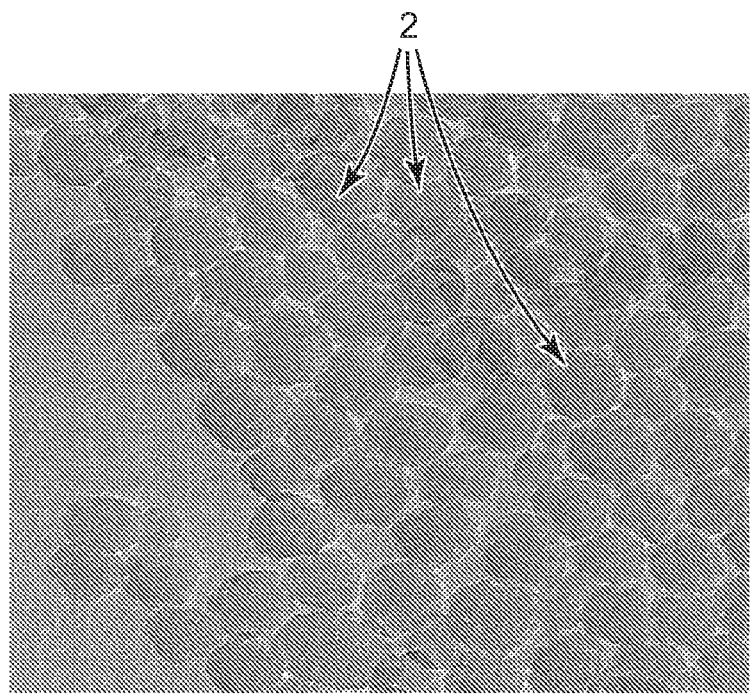
FIG. 2 is a scanning electron photomicrograph of a porous nanostructure surface prior to sintering.
Figure 3:
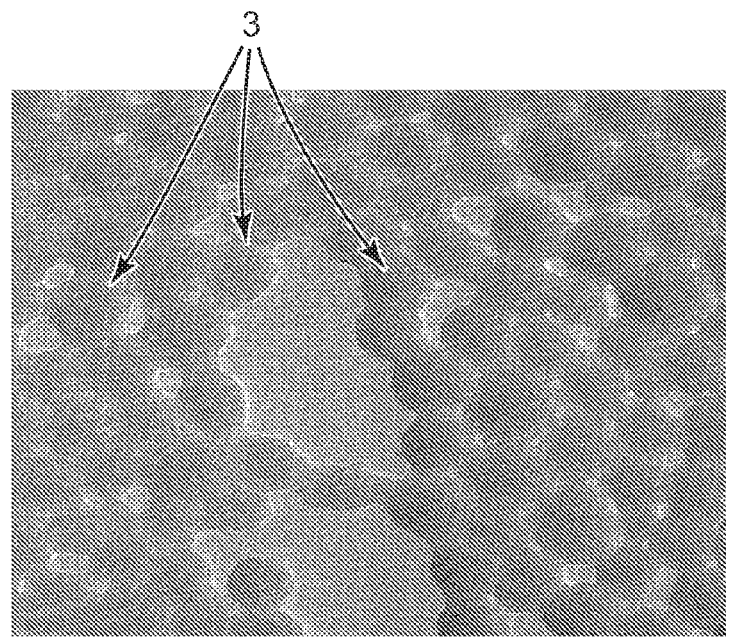
FIG. 3 is a scanning electron photomicrograph of a sintered, porous nanostructure surface.

Embodiments of the porous network (typically a three-dimensional network) of silica nanoparticles on the anti-reflective, structured surface of a transparent substrate can provided, for example, by:

applying a coating composition comprising silica nanoparticles onto an anti-reflective, structured surface of a transparent substrate to provide a coating, wherein the coating composition has a pH less than 3; and allowing the silica nanoparticles to acid sinter.

Embodiments of the porous network (typically a three-dimensional network) of silica nanoparticles on the anti-reflective, structured surface of a transparent substrate can provided, for example, by:

applying a coating composition comprising silica nanoparticles onto an anti-reflective, structured surface of a transparent substrate to provide a coating; and heating the coating.

Exemplary transparent substrates for anti-reflective, structured surfaces include polymerics (e.g., films and sheets) and glass. Typical polymeric materials include acrylates, polyesters, polycarbonates, cyclic olefin copolymers, silicones, and fluoropolymers. Polymeric films include multilayer optical films. Typically, multilayer optical films comprise at least 100 (typically in a range from 100 to 2000 total layers or more).

Additional examples of polymerics include polyester (e.g., polyethylene terephthalate, polybutylene terephthalate), cyclic olefin co-polymer (COC), fluoropolymers (e.g., ethylene tetrafluorethylene, polyvinylidene fluoride, THV), polycarbonate, allyldiglycol carbonate, polyacrylates such as polymethyl methacrylate, polystyrene, polysulfone, polyethersulfone, homo-epoxy polymers, epoxy addition polymers with polydiamines, polydithiols, polyethylene copolymers, fluorinated surfaces, cellulose esters (e.g., acetate and butyrate). In some embodiments, the substrate is flexible and made from polyesters (e.g., polyethylene terephthalate (PET)), cyclic olefin co-polymer (COC), and polyolefins (e.g., PP (polypropylene) and PE (polyethylene)), and PVC (polyvinyl chloride).

The substrate can be formed into a film using conventional filmmaking techniques such as extrusion of the substrate resin into a film and optional uniaxial or biaxial orientation of the extruded film. Suitable commercial films include polymethyl, methacrylate (PMMA) films available, for example, under trade designation "SOLATUF" from Rowland Industries, Wallingford, Conn., and polycarbonate (PC) films available under trade designation "OPTICAL LIGHTING FILM 2301" from 3M Company, St. Paul, Minn.

Other useful polymeric substrates include UV (i.e., ultraviolet light which as a wavelength less than 400 nm) mirrors such as multilayer optical films constructed of alternating layers of a UV stabilized polyethylene terephthalate (PET) and a copolymer of methyl(meth)acrylate and ethyl acrylate (CoPMMA) at thicknesses one quarter of the wavelength of the light they will reflect. This UV mirror has alternating polymer layers in the range of thicknesses that reflect UV light while passing visible light. Additional details for these films can be found in co-pending application having U.S. Ser. No. 61/262,417, filed Nov. 18, 2009, the disclosure of which is incorporated herein by reference.

Other useful polymeric substrates include IR mirrors such as are known in the art and include a multilayer optical films constructed of alternating layers of a UV stabilized polyethylene terephthalate (PET) and a copolymer of methyl(meth)acrylate and ethyl acrylate (CoPMMA) at thicknesses one quarter of the wavelength of the light they will reflect. This IR mirror has alternating polymer layers in the range of thicknesses that reflect IR light while passing visible light. Additional details for these films can be found in co-pending application having U.S. Pat. No. 4,229,066 (Rancourt et al.), U.S. Pat. No. 5,233,465 (Wheatley et al.), U.S. Pat. No. 5,449,413 (Beauchamp et al.), U.S. Pat. No. 6,049,419 (Wheatley et al.), U.S. Pat. No. 7,019,905 (Weber), U.S. Pat. No. 7,141,297 (Condo, et al.), and U.S. Pat. No. 7,215,473 (Fleming), the disclosure of which is incorporated herein by reference.

In some embodiments, a UV stable substrate comprises a multi-layer optical film comprising a first plurality of at least first and second optical layers having a major surface and collectively reflecting at least 50 (in some embodiments, at least 55, 60, 65, 70, 75, 80, 85, 90, 95, 96, 97, or even at least 98) percent of incident UV light over at least a 30 (in some embodiments, at least 35, 40, 45, 50, 55, 60, 65, 70, 75, 80, 85, 90, 95, or even at least 100) nanometer wavelength range in a wavelength range from at least 300 nanometers to 400 nanometers, and a third optical layer having first and second generally opposed first and second major surfaces and collectively absorbing at least 50 (in some embodiments, at least 55, 60, 65, 70, 75, 80, 85, 90, or even at least 95) percent of incident UV light over at least a 30 (in some embodiments, at least 35, 40, 45, 50, 55, 60, 65, 70, 75, 80, 85, 90, 95, or even at least 100) nanometer wavelength range in a wavelength range from at least 300 nanometers to 400 nanometers, wherein the major surface of the plurality of first and second optical layers is proximate (i.e., within 1 mm, in some embodiments, not more than 0.75 mm, 0.5 mm, 0.4 mm, 0.3 mm, 0.25 mm, 0.2 mm, 0.15 mm, 0.1 mm, or even within 0.05 mm; in some embodiments, contacting) to the first major surface of the third optical layer, and wherein there is a second plurality of first and second optical layers having a major surface and collectively reflecting at least 50 (in some embodiments, at least 55, 60, 65, 70, 75, 80, 85, 90, 95, 96, 97, or even at least 98) percent of incident UV light over at least a 30 (in some embodiments, at least 35, 40, 45, 50, 55, 60, 65, 70, 75, 80, 85, 90, 95, or even at least 100) nanometer wavelength range in a wavelength range from at least 300 nanometers to 400 nanometers proximate (i.e., within 1 mm, in some embodiments, not more than 0.75 mm, 0.5 mm, 0.4 mm, 0.3 mm, 0.25 mm, 0.2 mm, 0.15 mm, 0.1 mm, or even within 0.05 mm; in some embodiments, contacting) to the second major surface of the third optical layer. Optionally, at least some of the first and/or second layers (in some embodiments at least 50 percent by number of the first and/or second layers, in some embodiments all of at least one of the first or second layers) comprise a UV absorber.

Exemplary UV stable substrates can be formed by coextrusion of UV stable skin layers (e.g., PMMA (polymethylmethacrylate)/UVA (ultraviolet absorber), PMMA (polymethylmethacrylate)/PVDF (polyvinylidene fluoride)/UVA (ultraviolet absorber) with less UV stable polymers (e.g., polycarbonate and polyethylene terephthalate). Alternatively, UV stable skin layers can be laminated or adhered to less UV stable layers. Thicknesses of the UV stable skin layers relative to the core layer can be varied to optimize properties such as UV stability, ductility, toughness, hardness, and other desirable physical properties.

In some embodiments, a multi-layer optical film comprises a plurality of at least first and second optical layers having opposing first and second major surfaces and collectively reflecting at least 50 (in some embodiments, at least 55, 60, 65, 70, 75, 80, 85, 90, 95, 96, 97, or even at least 98) percent of incident UV light over at least a 30 (in some embodiments, at least 35, 40, 45, 50, 55, 60, 65, 70, 75, 80, 85, 90, 95, or even at least 100) nanometer wavelength range in a wavelength range from at least 300 nanometers to 400 nanometers, a third optical layer having a major surface and absorbing at least 50 (in some embodiments, at least 55, 60, 65, 70, 75, 80, 85, 90, or even at least 95) percent of incident UV light over at least a 30 (in some embodiments, at least 35, 40, 45, 50, 55, 60, 65, 70, 75, 80, 85, 90, 95, or even at least 100) nanometer wavelength range in a wavelength range from at least 300 nanometers to 400 nanometers proximate (i.e., within 1 mm, in some embodiments, not more than 0.75 mm, 0.5 mm, 0.4 mm, 0.3 mm, 0.25 mm, 0.2 mm, 0.15 mm, 0.1 mm, or even within 0.05 mm; in some embodiments, contacting) to the first major surface of the plurality of at least first and second optical layers, and a fourth optical layer absorbing at least 50 (in some embodiments, at least 55, 60, 65, 70, 75, 80, 85, 90, or even at least 95) percent of incident UV light over at least a 30

(in some embodiments, at least 35, 40, 45, 50, 55, 60, 65, 70, 75, 80, 85, 90, 95, or even at least 100) nanometer wavelength range in a wavelength range from at least 300 nanometers to 400 nanometers proximate (i.e., within 1 mm, in some embodiments, not more than 0.75 mm, 0.5 mm, 0.4 mm, 0.3 mm, 0.25 mm, 0.2 mm, 0.15 mm, 0.1 mm, or even within 0.05 mm; in some embodiments, contacting) to the second major surface of the plurality of at least first and second optical layers. Optionally, at least some of the first and/or second layers (in some embodiments at least 50 percent by number of the first and/or second layers, in some embodiments all of at least one of the first or second layers) comprise a UV absorber.

In some embodiments, alternating first and second layers of a multilayer optical films have a difference in refractive index of at least 0.04 (in some embodiments, at least 0.05, 0.06, 0.07, 0.08, 0.09, 0.1, 0.125, 0.15, 0.175, 0.2, 0.225, 0.25, 0.275, or even at least 0.3). In some embodiments, the first optical layer is birefringent and comprises a birefringent polymer. In some embodiments, at least one of the first, second, or third (if present) optical layer is at least one of fluoropolymer, silicone polymer, urethane polymer, or acrylate polymer (including blends thereof), and preferably is UV stable.

Exemplary materials for making the optical layers that reflect (e.g., the first and second optical layers) include polymers (e.g., polyesters, including copolyesters and modified copolyesters). In this context, the term "polymer" will be understood to include homopolymers and copolymers, as well as polymers or copolymers that may be formed in a miscible blend, for example, by co-extrusion or by reaction, including transesterification. The terms "polymer" and "copolymer" include both random and block copolymers. Polyesters suitable for use in some exemplary multilayer optical films constructed according to the present disclosure generally include dicarboxylate ester and glycol subunits and can be generated by reactions of carboxylate monomer molecules with glycol monomer molecules. Each dicarboxylate ester monomer molecule has two or more carboxylic acid or ester functional groups and each glycol monomer molecule has two or more hydroxy functional groups. The dicarboxylate ester monomer molecules may all be the same or there may be two or more different types of molecules. The same applies to the glycol monomer molecules. Also included within the term "polyester" are polycarbonates derived from the reaction of glycol monomer molecules with esters of carbonic acid.

Examples of suitable dicarboxylic acid monomer molecules for use in forming the carboxylate subunits of the polyester layers include 2,6-naphthalene dicarboxylic acid and isomers thereof; terephthalic acid; isophthalic acid; phthalic acid; azelaic acid; adipic acid; sebacic acid; norbornenedicarboxylic acid; bi-cyclo-octane dicarboxylic acid; 1,4-cyclohexanedicarboxylic acid and isomers thereof; t-butylisophthalic acid, trimellitic acid, sodium sulfonated isophthalic acid; 4,4'-biphenyl dicarboxylic acid and isomers thereof; and lower alkyl esters of these acids, such as methyl or ethyl esters. The term "lower alkyl" refers, in this context, to $C_1$-$C_{10}$ straight-chain or branched alkyl groups.

Examples of suitable glycol monomer molecules for use in forming glycol subunits of the polyester layers include ethylene glycol; propylene glycol; 1,4-butanediol and isomers thereof; 1,6-hexanediol; neopentyl glycol; polyethylene glycol; diethylene glycol; tricyclodecanediol; 1,4-cyclohexanedimethanol and isomers thereof; norbornanediol; bicyclooctanediol; trimethylolpropane; pentaerythritol; 1,4-benzenedimethanol and isomers thereof; Bisphenol A; 1,8-dihydroxybiphenyl and isomers thereof; and 1,3-bis(2-hydroxyethoxy)benzene.

Another exemplary birefringent polymer useful for the reflective layer(s) is polyethylene terephthalate (PET), which can be made, for example, by reaction of terephthalic dicarboxylic acid with ethylene glycol. Its refractive index for polarized incident light of 550 nm wavelength increases when the plane of polarization is parallel to the stretch direction from about 1.57 to as high as about 1.69. Increasing molecular orientation increases the birefringence of PET. The molecular orientation may be increased by stretching the material to greater stretch ratios and holding other stretching conditions fixed. Copolymers of PET (CoPET), such as those described in U.S. Pat. No. 6,744,561 (Condo et al.) and U.S. Pat. No. 6,449,093 (Hebrink et al.), the disclosures of which are incorporated herein by reference, are particularly useful for their relatively low temperature (typically less than 250° C.) processing capability making them more coextrusion compatible with less thermally stable second polymers. Other semicrystalline polyesters suitable as birefringent polymers include polybutylene terephthalate (PBT), polyethylene terephthalate (PET), and copolymers thereof such as those described in U.S. Pat. No. 6,449,093 B2 (Hebrink et al.) or U.S. Pat. Pub. No. 20060084780 (Hebrink et al.), the disclosures of which are incorporated herein by reference. Another useful birefringent polymer is syndiotactic polystyrene (sPS).

Further, for example, the second (layer) polymer of the multilayer optical film can be made from a variety of polymers having glass transition temperatures compatible with that of the first layer and having a refractive index similar to the isotropic refractive index of the birefringent polymer. Examples of other polymers suitable for use in optical films and, particularly, in the second polymer include vinyl polymers and copolymers made from monomers such as vinyl naphthalenes, styrene, maleic anhydride, acrylates, and methacrylates. Examples of such polymers include polyacrylates, polymethacrylates, such as poly(methyl methacrylate) (PMMA), and isotactic or syndiotactic polystyrene. Other polymers include condensation polymers such as polysulfones, polyamides, polyurethanes, polyamic acids, and polyimides. In addition, the second polymer can be formed from homopolymers and copolymers of polyesters, polycarbonates, fluoropolymers, and polydimethylsiloxanes, and blends thereof.

A third (UV-absorbing) optical layer(s), if present, and fourth (UV-absorbing) layer(s), if present, comprises a polymer and a UV-absorber, and preferably serves as a UV protective layer. Typically, the polymer is a thermoplastic polymer. Examples of suitable polymers include polyesters (e.g., polyethylene terephthalate), fluoropolymers, acrylics (e.g., polymethyl methacrylate), silicone polymers (e.g., thermoplastic silicone polymers), styrenic polymers, polyolefins, olefinic copolymers (e.g., copolymers of ethylene and norbornene available as "TOPAS COC" from Topas Advanced Polymers of Florence, Ky.), silicone copolymers, fluoropolymers, and combinations thereof (e.g., a blend of polymethyl methacrylate and polyvinylidene fluoride).

Other exemplary polymers, for the optical layers, especially for use in the second layer, include homopolymers of polymethylmethacrylate (PMMA), such as those available from Ineos Acrylics, Inc., Wilmington, Del., under the trade designations "CP71" and "CP80;" and polyethylmethacrylate (PEMA), which has a lower glass transition temperature than PMMA. Additional useful polymers include copolymers of PMMA (CoPMMA), such as a CoPMMA made from 75 wt % methyl methacrylate (MMA) monomers and 25 wt % ethyl acrylate (EA) monomers, (available from Ineos Acrylics, Inc., under the trade designation "PERSPEX CP63" or Arkema, Philadelphia, Pa., under the trade designation "ATOGLAS 510"), a CoPMMA formed with MMA comonomer units and n-butyl methacrylate (nBMA) comonomer units, or a blend of PMMA and poly(vinylidene fluoride) (PVDF).

Additional suitable polymers for the optical layers, especially for use in the second layer, include polyolefin copolymers such as poly(ethylene-co-octene) (PE-PO) available from Dow Elastomers, Midland, Mich., under the trade designation "ENGAGE 8200," poly(propylene-co-ethylene) (PPPE) available from Atofina Petrochemicals, Inc., Houston, Tex., under the trade designation "Z9470," and a copolymer of atactic polypropylene (aPP) and isotactic polypropylene (iPP). The multilayer optical films can also include, for example, in the second layers, a functionalized polyolefin, such as linear low density polyethylene-graft-maleic anhydride (LLDPE-g-MA) such as that available from E.I. duPont de Nemours & Co., Inc., Wilmington, Del., under the trade designation "BYNEL 4105."

Preferred polymer compositions for a third layer and/or second layers in alternating layers with the at least one birefringent polymer include PMMA, CoPMMA, poly(dimethylsiloxane oxamide) based segmented copolymer (SPDX), fluoropolymers including homopolymers such as PVDF and copolymers such as those derived from tetrafluoroethylene, hexafluoropropylene, and vinylidene fluoride (THV), blends of PVDF/PMMA, acrylate copolymers, styrene, styrene copolymers, silicone copolymers, polycarbonate, polycarbonate copolymers, polycarbonate blends, blends of polycarbonate and styrene maleic anhydride copolymers, and cyclic-olefin copolymers.

Preferred material combinations for making the optical layers that reflect UV light (e.g., the first and second optical layers) include PMMA (e.g., first layer)/THV (e.g., second layer), PC (polycarbonate) (e.g., first layer)/PMMA (e.g., second layer), PET (e.g., first layer)/CoPMMA (e.g., second layer), and PET (e.g., first layer)/PVDF/PMMA blend (e.g. second layer).

Exemplary material for making the optical layers that absorb UV light (e.g., the third optical layer) include fluoropolymers, urethane polymers, acrylate polymers, PC, PMMA, CoPMMA, or blends of PMMA and PVDF, and a UV absorber.

Multilayer optical films described herein can be made using the general processing techniques, such as those described in U.S. Pat. No. 6,783,349 (Neavin et al.), the disclosure of which is incorporated herein by reference.

Desirable techniques for providing a multilayer optical film with a controlled spectrum include the use of an axial rod heater control of the layer thickness values of coextruded polymer layers as described, for example, in U.S. Pat. No. 6,783,349 (Neavin et al.); timely layer thickness profile feedback during production from a layer thickness measurement tool such as e.g. an atomic force microscope (AFM), a transmission electron microscope, or a scanning electron microscope; optical modeling to generate the desired layer thickness profile; and repeating axial rod adjustments based on the difference between the measured layer profile and the desired layer profile.

The basic process for layer thickness profile control involves adjustment of axial rod zone power settings based on the difference of the target layer thickness profile and the measured layer profile. The axial rod power increase needed to adjust the layer thickness values in a given feedblock zone may first be calibrated in terms of watts of heat input per nanometer of resulting thickness change of the layers generated in that heater zone. For example, fine control of the spectrum is possible using 24 axial rod zones for 275 layers. Once calibrated, the necessary power adjustments can be calculated once given a target profile and a measured profile. The procedure is repeated until the two profiles converge.

The layer thickness profile (layer thickness values) of multi-layer optical film described herein reflecting at least 50 percent of incident UV light over a specified wavelength range can be adjusted to be approximately a linear profile with the first (thinnest) optical layers adjusted to have about a ¼ wave optical thickness (index times physical thickness) for 300 nm light and progressing to the thickest layers which would be adjusted to be about ¼ wave thick optical thickness for 400 nm light.

Some embodiments of multi-layer optical films described herein have a UV transmission band edge in a range from 10 to 90 percent transmission spanning less than 20 (in some embodiments, less than 10) nanometers.

Exemplary thicknesses of multi-layer optical films described herein have a thickness in a range from 25 micrometers to 250 micrometers. Exemplary thicknesses of optical layers (e.g., the third optical layer) that absorb have a collective thickness in a range from 10 micrometers to 200 micrometers.

Other useful polymeric substrates include UV stable substrates such as a film or part made from a polymer that generally maintains its optical and mechanical properties during outdoor exposure to sunlight and the elements for a period of at least 10 years either through the addition of UV absorbers, anti-oxidants and hindered amine light stabilizers and/or through the polymer's intrinsic weatherability (e.g., fluoropolymers).

Solar light, in particular the ultraviolet radiation from 280 to 400 nm, can induce degradation of plastics, which in turn results in color change and deterioration of optical and mechanical properties. Inhibition of photo-oxidative degradation is important for outdoor applications wherein long term durability is mandatory. The absorption of UV-light by polyethylene terephthalates, for example, starts at around 360 nm, increases markedly below 320 nm, and is very pronounced at below 300 nm. Polyethylene naphthalates strongly absorb UV-light in the 310-370 nm range, with an absorption tail extending to about 410 nm, and with absorption maxima occurring at 352 nm and 337 nm. Chain cleavage occurs in the presence of oxygen, and the predominant photooxidation products are carbon monoxide, carbon dioxide, and carboxylic acids. Besides the direct photolysis of the ester groups, consideration has to be given to oxidation reactions, which likewise form carbon dioxide via peroxide radicals.

Therefore it may be desirable in some embodiments to include a UV absorbing layer to protect the substrate (e.g., multilayer optical film) by reflecting UV light, absorbing UV light, scattering UV light, or a combination thereof. In general, a UV absorbing layer may include any polymer composition that is capable of withstanding UV radiation for an extended period of time while either reflecting, scattering, or absorbing UV radiation. Examples of such polymers include PMMA, silicone thermoplastics, fluoropolymers, and their copolymers, and blends thereof. An exemplary UV absorbing layer comprises PMMA/PVDF/UVA blends.

A variety of optional additives may be incorporated into an optical layer to make it UV absorbing. Examples of such additives include at least one of an ultra violet absorber(s), a hindered amine light stabilizer(s), or an anti-oxidant(s) thereof.

In some embodiments, particularly desirable UV absorbers are red shifted UV absorbers (RUVA) which absorb at least 70% (in some embodiments, at least 80%, particularly preferably greater than 90% of the UV light in the wavelength region from 180 nm to 400 nm. Typically, it is desirable if the RUVA is highly soluble in polymers, highly absorptive, photo-permanent and thermally stable in the temperature range from 200° C. to 300° C. for extrusion process to form the protective layer. The RUVA can also be highly suitable if they can be copolymerizable with monomers to form protective coating layer by UV curing, gamma ray curing, e-beam curing, or thermal curing processes.

RUVAs typically have enhanced spectral coverage in the long-wave UV region, enabling it to block the high wavelength UV light that can cause yellowing in polyesters. Typical UV protective layers have thicknesses in a range from 13 micrometers to 380 micrometers (0.5 mil to 15 mil) with a RUVA loading level of 2-10%). Other preferred benzotriazoles include 2-(2-hydroxy-3,5-di-alpha-cumylphehyl)-2H-benzotriazole, 5-chloro-2-(2-hydroxy-3-tert-butyl-5-methylphenyl)-2H-benzothiazole, 5-chloro-2-(2-hydroxy-3,5-di-tert-butylphenyl)-2H-benzotriazole, 2-(2-hydroxy-3,5-di-tert-amylphenyl)-2H-benzotriazole, 2-(2-hydroxy-3-alpha-cumyl-5-tert-octylphenyl)-2H-benzotriazole, 2-(3-tert-butyl-2-hydroxy-5-methylphenyl)-5-chloro-2Hbenzotriazole. Further preferred RUVA includes 2(–4,6-diphenyl-1-3,5-triazin-2-yl)-5-hekyloxy-phenol. Other exemplary UV absorbers include those available from Ciba Specialty Chemicals Corporation, Tarrytown, N.Y., under the trade designation "TINUVIN 1577," "TINUVIN 900," and "TINUVIN 777." Preferred UV absorbers include biphenyl-triazines available from Sukano as masterbatch concentrates under the trade designations "PMMA(TA11-10 MB01)," "PC (TA28-09 MB02)," and "PET(TA07-07 MB01)." In addition, the UV absorbers can be used in combination with hindered amine light stabilizers (HALS) and anti-oxidants. Exemplary HALS include those available from Ciba Specialty Chemicals Corporation, under the trade designation "CHIMASSORB 944" and "TINUVIN 123." Exemplary anti-oxidants include those obtained under the trade designations "IRGANOX 1010" and "ULTRANOX 626", also available from Ciba Specialty Chemicals Corporation.

In some embodiments, a UV filter (protective) layer is a multilayer optical film that reflects wavelengths of light from about 350 to about 400 nm, (in some embodiments from 300 nm to 400 nm). In these embodiments, the polymers for the UV absorbing layer preferably do not absorb UV light in the 300 nm to 400 nm range. Examples of the materials that are desirable for such embodiments include PMMA/THV, PET/SPDX, PMMA/SPDX, modified polyolefin copolymers (EVA) with THV, TPU/THV, and TPU/SPDX. In one exemplary embodiment, THV available under the trade designation "DYNEON THV 220 GRADE" and "DYNEON THV 2030 GRADE" from Dyneon LLC, Oakdale, Minn., are employed with PMMA for multilayer UV mirrors reflecting 300-400 nm or with PET for multilayer mirrors reflecting 350-400 nm.

Other additives may be included in a UV absorbing layer (e.g., a UV protective layer). Small particle non-pigmentary zinc oxide and titanium oxide can also be used as blocking or scattering additives in a UV absorbing layer. For example, nano-scale particles can be dispersed in polymer or coating substrates to minimize UV radiation degradation. The nano-scale particles are transparent to visible light while either scattering or absorbing harmful UV radiation thereby reducing damage to thermoplastics. U.S. Pat. No. 5,504,134 (Palmer et al.) describes attenuation of polymer substrate degradation due to ultraviolet radiation through the use of metal oxide particles in a size range of about 0.001 micrometer to about 0.2 micrometer in diameter, and more preferably from about 0.01 micrometer to about 0.15 micrometer in diameter. U.S. Pat. No. 5,876,688 (Laundon) describes a method for producing micronized zinc oxide that are small enough to be transparent when incorporated as UV blocking and/or scattering agents in paints, coatings, finishes, plastic articles, cosmetics and the like which are well suited for use in the present invention. These fine particles such as zinc oxide and titanium oxide with particle size ranged from 10-100 nm that can attenuate UV radiation are available, for example, from Kobo Products, Inc., South Plainfield, N.J. Flame retardants may also be incorporated as an additive in a UV protective layer.

In addition to adding UV absorbers, HALS, nano-scale particles, flame retardants, and anti-oxidants to a UV absorbing layer, the UV absorbers, HALS, nano-scale particles, flame retardants, and anti-oxidants can be added to the multilayer optical layers, and any optional durable top coat layers. Fluorescing molecules and optical brighteners can also be added to a UV absorbing layer, the multilayer optical layers, an optional hardcoat layer, or a combination thereof.

The desired thickness of a UV protective layer is typically dependent upon an optical density target at specific wavelengths as calculated by Beers Law. In some embodiments, the UV protective layer has an optical density greater than 3.5, 3.8, or 4 at 380 nm; greater than 1.7 at 390 nm; and greater than 0.5 at 400 nm. Those of ordinary skill in the art recognize that the optical densities typically should remain fairly constant over the extended life of the article in order to provide the intended protective function.

The UV protective layer, and any optional additives, may be selected to achieve the desired protective functions such as UV protection, ease in cleaning, and durability in the solar concentrating mirror. Those of ordinary skill in the art recognize that there are multiple means for achieving the noted objectives of the UV protective layer. For example, additives that are very soluble in certain polymers may be added to the composition. Of particular importance, is the permanence of the additives in the polymer. The additives should not degrade or migrate out of the polymer. Additionally, the thickness of the layer may be varied to achieve desired protective results. For example, thicker UV protective layers would enable the same UV absorbance level with lower concentrations of UV absorbers, and would provide more UV absorber permanence attributed to less driving force for UV absorber migration. One mechanism for detecting the change in physical characteristics is the use of the weathering cycle described in ASTM G155-05a (October, 2005), the disclosure of which is incorporated herein by reference, and a D65 light source operated in the reflected mode. Under the noted test, and when the UV protective layer is applied to the article, the article should withstand an exposure of at least 18,700 kJ/m$^2$ at 340 nm before the b* value obtained using the CIE L*a*b* space increases by 5 or less, 4 or less, 3 or less, or 2 or less before the onset of significant cracking, peeling, delamination, or haze. In one exemplary version of the test the article is exposed for 3000 hours to a Xenon arc lamp weatherometer according to ASTM G155-05a (October, 2005), has a change in b* of less than 5 units when measured with the spectrophotometer (available from Perkin-Elmer, Inc., Waltham, Mass., under the trade designation "LAMBDA 950").

The substrate surface on which the coating composition is coated may have a structured surface provided when the substrate is made, or may be added to the surface of the substrate. In some embodiments, the anti-reflective structured surface is a micro-structured surface. The structured surface can be provided by techniques known in the art including extrusion replication, embossing, and casting, followed by, if needed, curing.

In general, the extrusion replication procedure utilize a tool that will impart the negative structure in the polymer surface. The tooling can be of a variety of forms and materials. Commonly the form of the tooling will either be a sheet, roll, belt or roll of surface structured film. The tooling is generally constructed of material that falls either into the category of metal or polymer but could potentially include ceramic or other suitable material. For metal tools, the metal is generally diamond-machined, embossed, knurled, sandblasted, etc. to form the surface structure. The structured polymer surface is generally formed by extrusion replication where a thermoplastic resin such as PMMA is extruded using standard extrusion equipment and fed through a die and into a nip with a machined metal tool roll and a rubber roll. The molten polymer is quenched while in contact with the tool surface which then releases from the tool roll and is wound on a roll.

Another procedure for making structured surfaces is to coat UV curable acrylate functional resins against a tool followed by removal of the cross-linked structured film from the tool.

Another procedure for making structured surfaces is to coat thermally curable urethane functional resins against a tool followed by removal of the cross-linked structured film from the tool. This polyurethane layer can be prepared from the condensation polymerization of a reaction mixture that comprises a polyol, a polyisocyanate, and a catalyst. The reaction mixture may also contain additional components which are not condensation polymerizable, and generally contains at least one UV stabilizer. As will be described below, the condensation polymerization reaction, or curing, generally is carried out in a mold or tool to generate the structured surface in the cured surface.

Because the polyurethane polymers described in this disclosure are formed from the condensation reaction of a polyol and a polyisocyanate they contain at least polyurethane linkages. The polyurethane polymers formed in this disclosure may contain only polyurethane linkages or they may contain other optional linkages such as polyurea linkages, polyester linkages, polyamide linkages, silicone linkages, acrylic linkages, and the like. As described below, these other optional linkages can appear in the polyurethane polymer because they were present in the polyol or the polyisocyanate materials that are used to form the polyurethane polymer. Typically the structured polyurethane layer is of a sufficient size to produce a desired optical effect. The polyurethane layer is generally no more than 10 millimeters thick, typically much thinner. For economical reasons, it is generally desirable to use a structured polyurethane layer which is as thin as possible. It may be desirable to maximize the amount of polyurethane material which is contained in the structures and to minimize the amount of polyurethane material that forms the base of the structured polyurethane layer but is not structured. In some instances this base portion is sometimes referred to as "the land" as it is analogous to the land from which mountains arise.

A wide variety of polyols may be used. The term polyol includes hydroxyl-functional materials that generally comprise at least 2 terminal hydroxyl groups and may be generally described by the structure HO—B—OH, where the B group may be an aliphatic group, an aromatic group, or a group containing a combination of aromatic and aliphatic groups, and may contain a variety of linkages or functional groups, including additional terminal hydroxyl groups. Typically the HO—B—OH is a diol or a hydroxyl-capped prepolymer such as a polyurethane, polyester, polyamide, silicone, acrylic, or polyurea prepolymer.

Examples of useful polyols include polyester polyols (e.g., lactone polyols), polyether polyols (e.g., polyoxyalkylene polyols), polyalkylene polyols, mixtures thereof, and copolymers therefrom. Polyester polyols are particularly useful. Among the useful polyester polyols are linear and non-linear polyester polyols including, for example, those made from polyethylene adipate, polybutylene succinate, polyhexamethylene sebacate, polyhexamethylene dodecanedioate, polyneopentyl adipate, polypropylene adipate, polycyclohexanedimethyl adipate, and poly ∈-caprolactone. Aliphatic polyester polyols are available, for example, from King Industries, Norwalk, Conn., under the trade name "K-FLEX" (e.g., "K-FLEX 188" and "K-FLEX A308").

Where HO—B—OH is a hydroxyl-capped prepolymer, a wide variety of precursor molecules can be used to produce the desired HO—B—OH prepolymer. For example, the reaction of polyols with less than stoichiometric amounts of diisocyanates can produce a hydroxyl-capped polyurethane prepolymer. Examples of suitable diisocyanates include aromatic diisocyanates (e.g., 2,6-toluene diisocyanate, 2,5-toluene diisocyanate, 2,4-toluene diisocyanate, m-phenylene diisocyanate, p-phenylene diisocyanate, methylene bis(o-chlorophenyl diisocyanate), methylenediphenylene-4,4'-diisocyanate, polycarbodiimide-modified methylenediphenylene diisocyanate, (4,4'-diisocyanato-3,3',5,5'-tetraethyl) biphenylmethane, 4,4'-diisocyanato-3,3'-dimethoxybiphenyl, 5-chloro-2,4-toluene diisocyanate, 1-chloromethyl-2,4-diisocyanato benzene, aromatic-aliphatic diisocyanates, as m-xylylene diisocyanate, and tetramethyl-m-xylylene diisocyanate), aliphatic diisocyanates 1,4-diisocyanatobutane, 1,6-diisocyanatohexane, 1,12-diisocyanatododecane, 2-methyl-1,5diisocyanatopentane, and cycloaliphatic diisocyanates (e.g., methylene-dicyclohexylene-4,4'-diisocyanate, and 3-isocyanatomethyl-3,5,5-trimethylcyclohexyl isocyanate (isophorone diisocyanate)). For reasons of weatherability, generally aliphatic and cycloaliphatic diisocyanates are used.

An example of the synthesis of a HO—B—OH prepolymer is shown in Reaction Scheme 1 (where (CO) represents a carbonyl group C═O) below:

2HO—R¹—OH+OCN—R²—NCO→HO—R¹—O—[(CO)N—R²—N(CO)O—R¹—O—]$_n$H 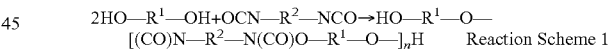Reaction Scheme 1 where n is one or greater, depending upon the ratio of polyol to diisocyanate, for example, when the ratio is 2:1, n is 1. Similar reactions between polyols and dicarboxylic acids or dianhydrides can give HO—B—OH prepolymers with ester linking groups.

Polyols with more than two hydroxyl groups per molecule will lead to a crosslinked resin upon reaction with di or higher functionality isocyanates. Crosslinking prevents creep of the formed polymer, and helps maintain the desired structure. Typically the polyol is an aliphatic polyester polyol (available, for example, from King Industries, Norwalk, Conn., under the trade name "K-FLEX" (e.g., "K-FLEX 188" and "K-FLEX A308").

A wide variety of polyisocyanates may be used. The term polyisocyanate includes isocyanate-functional materials that generally comprise at least 2 terminal isocyanate groups, such as diisocyanates that may be generally described by the structure OCN—Z—NCO, where the Z group may be an aliphatic group, an aromatic group, or a group containing a combination of aromatic and aliphatic groups. Examples of suitable diisocyanates include aromatic diisocyanates (e.g., 2,6-toluene diisocyanate, 2,5-toluene diisocyanate, 2,4-toluene diisocyanate, m-phenylene diisocyanate, p-phenylene diisocyanate, methylene bis(o-chlorophenyl diisocyanate), methylenediphenylene-4,4'-diisocyanate, polycarbodiimide-modified methylenediphenylene diisocyanate, (4,4'-diisocyanato-3,3',5,5'-tetraethyl) biphenylmethane, 4,4'-diisocyanato-3,3'-dimethoxybiphenyl, 5-chloro-2,4-toluene diisocyanate, and 1-chloromethyl-2,4-diisocyanato benzene), aromatic-aliphatic diisocyanates (e.g., m-xylylene diisocyanate, and tetramethyl-m-xylylene diisocyanate), aliphatic diisocyanates, (e.g. 1,4-diisocyanatobutane, 1,6-diisocyanatohexane, 1,12-diisocyanatododecane, and 2-methyl-1,5diisocyanatopentane), and cycloaliphatic diisocyanates (e.g., methylene-dicyclohexylene-4,4'-diisocyanate, and 3-isocyanatomethyl-3,5,5-trimethyl-cyclohexyl isocyanate (isophorone diisocyanate). For reasons of weatherability, generally aliphatic and cycloaliphatic diisocyanates are used. Some degree of crosslinking is useful in maintaining the desired structured surface. One approach is to use polyisocyanates with a higher functionality than 2.0. One exemplary aliphatic polyisocyanate is available under the trade designation "DESMODUR N3300A" from Bayer, Pittsburgh, Pa.

Another procedure for making structured surfaces is to heat a polymeric film and then contact it with an embossing roll or belt having a desired structured surface thus imparting the negative of the surface pattern into the polymeric film.

The use of anti-reflective structured films as disclosed herein, have demonstrated reductions in the amount of light that is reflected and does not, for example, reach a light absorbing element(s) of a light energy absorbing device. For example, such anti-reflective structured films have enabled conventional photovoltaic solar modules to experience average power output increases in the range of from about 3% to about 7%. These anti-reflective structured films can help maintain the transparency to light of such anti-reflective structured films, during the life of the light energy absorbing device, by improving the resistance to dirt and dust particle pick-up (i.e., dirt resistance) and/or abrasion resistance of the exposed surface of the anti-reflective structured film. In this way, the films can help to increase the transmission of light to a light energy absorbing device. In particular, by more highly cross-linking the polymeric material at the structured surface of the structured face, the structured face can exhibit improved mechanical durability (e.g., resistance to falling sand) compared to the same polymeric material without the higher cross-linking, as well as compared to the same structured face made with other polymeric materials (e.g., polyurethanes).

Light energy absorbing devices, and especially the structured face of the anti-reflective structured film, may be exposed to a variety of detrimental conditions from outside environments. For example, the structured face can be exposed to environmental elements such as rain, wind, hail, snow, ice, blowing sand, and the like which can damage the structured surface of the structured face. In addition, long term exposure to other environmental conditions such as heat and UV radiation exposure from the sun can also cause degradation of the structured face. For example, many polymeric organic materials are susceptible to breaking down upon repeated exposure to UV radiation. Weatherability for light energy absorbing devices such as, for example, a solar energy conversion device is generally measured in years, because it is desirable that the materials be able to function for years without deterioration or loss of performance. It is desirable for the materials to be able to withstand up to 20 years of outdoor exposure without significant loss of optical transmission or mechanical integrity. Typical polymeric organic materials are not able to withstand outdoor exposure without loss of optical transmission or mechanical integrity for extended periods of time, such as 20 years. In at least some embodiments, the structured face is expected to exhibit dirt resistance and/or mechanical durability in the range of from at least about 5 years to at least about 20 years, and possibly longer (e.g., at least about 25 years). In addition, because it is made of a UV stable polymeric material, the structured face can exhibit long term UV stability of at least about 15 years, about 20 years, or even about 25 years.

In some embodiments, the structured surface is comprised of polymeric material (including cross-linked polymer material). For transparent films, for example, in some embodiments the structured surface has a cross-link polymer density that is higher than a remainder of the film. For transparent films, for example, in some embodiments the structured surface has a polymer cross-link density that is higher than a remainder of the anti-reflective structured film. For transparent films, for example, in some embodiments a core portion of each of the structures has a lower polymer cross-link density than that of the structured surface. For transparent films, for example, in some embodiments the film further comprises a base portion from which the structures extend, all of the polymer elastomeric material of each of the structures has a polymer cross-link density about as high as that of the structured surface, and the base portion has a lower polymer cross-link density than that of each of the structures.

A transparent anti-reflective structured film can be made, for example, by providing a transparent structured film substrate as described above and then treating the structured surface such that the structured surface has a higher polymeric cross-link density than the remainder of the structured film substrate. The structured surface of the structured film substrate can be treated, for example, by being exposed to a treatment (e.g., an e-beam radiation treatment) that causes further cross-linking of the cross-linked polymeric material. Depending on the settings (e.g., intensity, voltage, and/or duration) of the treatment (e.g., conventional e-beam radiation techniques) used to further cross-link the already cross-linked polymeric material, there may be a remaining portion of the structured film substrate that does not exhibit the higher polymeric cross-link density. Low voltage (less than 150 kV) e-beam radiation will create higher cross-link density near the surface of the cross-linked polymer. For example, in the treatment settings may also be chosen so that the anti-reflective structures have a polymeric cross-link density about as high as that of the structured surface (i.e., the entire anti-reflective structure is treated so as to exhibit about the same polymeric cross-link density as that of its structured surface). Alternatively, the treatment settings may be chosen so that a core portion of each of the anti-reflective structures does not have a polymeric cross-link density about as high as that of the structured surface.

In some embodiments, the structured film substrate has a variable crosslink density throughout the thickness of the film substrate. For example, there may be a crosslink density gradient across the thickness of the structured film substrate, with the crosslink density being the highest at the structured surface of the structured film substrate and at its lowest at the surface opposite the structured surface. The crosslink density may be increased at the surface of the structured film substrate using electron beam irradiation at relatively low voltages such as in the range of from about 70 kV to about 150 kV.

In some embodiments, the surface structure comprises prisms. In some embodiments, the prisms each comprise a prism tip angle in the range of from 15 degrees to 75 degrees and a pitch in the range of from 10 micrometers to 250 micrometers. In some embodiments, the prisms each comprise an average slope angle in the range of from 15 degrees to 75 degrees and a pitch in the range of from 10 micrometers to 250 micrometers. In some embodiments, the prisms have a trough to peak height in the range of from 10 micrometers to 250 micrometers. The prisms can be provided by techniques known in the art, including those described in the microreplication techniques discussed above.

In some embodiments, the transparent film has a machine direction and the surface structure comprises prisms that have linear grooves, parallel to the machine direction of the film. Such a film can be made by techniques known in the art (e.g., by utilizing a tool having parallel and linear grooves provided circumferentially around the tool).

Further, the anti-reflective structures can comprise at least one or a combination of prismatic, pyramidal, conical, hemispherical, parabolic, cylindrical, and columnar structures. The anti-reflective structures comprising prisms can have a prism tip angle of less than 90 degrees, less than or equal to about 60 degrees, less than or equal to about 30 degrees, or in the range of from about 10 degrees up to about 90 degrees. Such anti-reflective prism structure can also exhibit a trough-to-trough or peak-to-peak pitch in the range of from about 2 micrometers to about 2 cm. The anti-reflective structures comprising prisms can also have a prism tip angle in the range of from about 15 degrees to about 75 degrees. The anti-reflective structures comprising prisms can also have a pitch in the range of from about 10 microns to about 250 micrometers.

In some embodiments, the surface structure has peaks and valleys and an average peak to valley height, wherein the sintered coating has an average thickness, and wherein the average thickness of the sintered coating is up to half (in some embodiments, less than 25 percent) of the average peak to valley height.

In some embodiments, the sintered coating comprising the porous network of silica nanoparticles can be provided by applying a coating composition comprising silica nanoparticles onto the anti-reflective, structured surface of the transparent substrate to provide a coating, and then heating the coating to provide the article.

In some embodiments, the sintered coating comprising the porous network of silica nanoparticles can be provided by applying a coating composition comprising silica nanoparticles onto the anti-reflective, structured surface of the transparent substrate to provide a coating, wherein the coating composition has a pH less than 3, and then allowing the silica nanoparticles to acid sinter to provide the article.

In some embodiments, the sintered coating comprising the porous network of silica nanoparticles can be provided by applying a coating composition comprising core-shell silica nanoparticles onto the anti-reflective, structured surface of the transparent substrate to provide a coating, wherein each core-shell particle comprises a polymer core surrounded by a shell of nonporous spherical silica particles disposed on the polymer core, and wherein the nonporous spherical silica particles have a volume average particle diameter of not greater than 60 nanometers (in some embodiments not greater than 50 nanometers, 40 nanometers, 30 nanometers, 20 nanometers, or even not greater than 10 nanometers), and then heating the coating to provide the article.

Exemplary coating compositions include aqueous dispersions and organic solvent dispersions of silica nanoparticles. In some embodiments, the nanoparticle-containing coating composition includes an aqueous dispersion having a pH of less than 5 comprising silica nanoparticles having average particle diameters of up to 40 nanometers (preferably, less than 20 nanometers), and an acid having a $pK_a$ of <3.5 (preferably <2.5, most preferably less than 1). A preferred nanoparticle-containing coating comprises agglomerates of silica nanoparticles having average particle diameters of up to 40 nanometers, the agglomerates comprising a porous network (typically a three-dimensional network) of silica nanoparticles, and the silica nanoparticles are bonded to adjacent silica nanoparticles.

These acidified aqueous silica nanoparticle coating compositions, can be coated directly onto hydrophobic organic and inorganic substrates without either organic solvents or surfactants. The wetting property of these inorganic nanoparticle aqueous dispersions on hydrophobic surfaces (e.g., polyethylene terephthalate (PET) or polycarbonate (PC) is a function of the pH of the dispersions and the $pK_a$ of the acid). The coating compositions are coatable on hydrophobic organic substrates when they are acidified with HCl to pH=2 to 3, and even to 4 or 5 in some embodiments. In contrast, the coating compositions bead up on the organic substrates at neutral or basic pH.

Silica nanoparticles used in these coating composition are typically dispersions of submicron size silica nanoparticles in an aqueous, organic solvent or in a water/organic solvent mixture. Generally, the silica nanoparticles have an average primary particle diameter of up to 40 nanometers, preferably less than 20 nanometers, and more preferably less than 10 nanometers. The average particle size may be determined using transmission electron microscopy. The nanosilica described in this disclosure may be spherical or nonspherical. The silica nanoparticles are preferably not surface modified.

Inorganic silica sols in aqueous media are well known in the art and available commercially. Silica sols in water or water-alcohol solutions are available, for example, under the trade designations "LUDOX" from E.I. duPont de Nemours and Co., Inc., Wilmington, Del.; "NYACOL" from Nyacol Co., Ashland, Mass.; and "NALCO" from Ondea Nalco Chemical Co., Oak Brook, Ill. One useful silica sol is NALCO 2326 available as a silica sol with mean particle size of 5 nanometers, pH 10.5, and solid content 15% by weight. Other commercially available silica nanoparticles include "NALCO 1115" and "NALCO 1130," commercially available from NALCO Chemical Co., "REMASOL SP30," commercially available from Remet Corp., Utica, N.Y., and "LUDOX SM," commercially available from E.I. Du Pont de Nemours Co., Inc.

In some embodiments, the coating composition has a pH of less than 5, 4.5, 4, 3.5, 3, or even less than 3; or in a range from 1 to 3. Such aqueous coating compositions can be prepared, for example, by combining at least a dispersion comprising silica nanoparticles and an acid having a lower pH than the dispersion (e.g., an acid having a $pK_a$ of <3.5). Exemplary acids include at least one of oxalic acid, citric acid, $H_3PO_4$, HCl, HBr, HI, $HBrO_3$, $HNO_3$, $HClO_4$, $H_2SO_4$, $CH_3SO_3H$, $CF_3SO_3H$, $CF_3CO_2H$, or $CH_3SO_2OH$.

In some embodiments, the porous network of silica nanoparticles is obtained by acid sintering of the silica nanoparticles as the water evaporates and the acid concentration increases. In some embodiments, alternatively, or in addition, the silica nanoparticles can be sintered with a heat treatment (e.g., flame treatment). Heat treatment can be conducted, for example, by passing the structured substrate under a flame (burner) for typically about 1-3 seconds, or even longer provided the substrate is not subjected to conditions that melt the substrate. Other techniques of heating may also include, for example, infra-red heaters, and hot air blowers. The surface opposite the coated surface can be cooled, for example, by a chilled metal roll or via liquid application to enable longer residence times under the flame.

In some embodiment, the present disclosure provides a composition comprising: an aqueous continuous liquid phase; and core-shell particles dispersed in the aqueous continuous liquid phase, wherein each core-shell particle comprises a polymer core surrounded by a shell of nonporous spherical silica particles disposed on the polymer core, and wherein the nonporous spherical silica particles have a volume average particle diameter of 60 nanometers (in some embodiments less than 50 nanometers, 40 nanometers, 30 nanometers, 20 nanometers, or even less than 10 nanometers; in some embodiments, in a range from 5 nanometers to 60 nanometers. In some embodiments, the weight ratio of a total amount of the nonporous spherical silica particles in the composition to a total amount of polymer in the composition is in a range of from 85:15 to 95:5. In some embodiments, the composition further comprises a surfactant. In some embodiments, the polymer core comprises a film-forming thermoplastic polymer which may comprise a polyurethane segment.

To achieve shell formation the nonporous spherical silica particles should typically be smaller than the polymer core, although this is not a requirement. For example, the volume average particle diameter (D50) of the polymer particles may be on the order of at least 3 times greater than the volume average particle diameter (D50) of the spherical silica particles. More typically, the volume average particle diameter of the polymer particles should typically be on the order of at least 5 times, at least 10 times, or even at least 50 times greater than the volume average particle diameter of the spherical silica particles. For typical polymer particle sizes, a weight ratio of the nonporous spherical silica particles to the one or more polymer particles is in a range of from 30:70 to 97:3, preferably 80:20 to 95:5, and more preferably 85:15 to 95:5.

In some embodiments, the coating compositions have a pH value of less than 5. In some embodiments, the coating compositions are free of acicular silica particles.

In some embodiments, the coating composition further comprises an organosilane binder (e.g., tetraalkoxysilane), a surfactant, and/or a wetting agent.

Exemplary surfactants include anionic surfactants. Useful anionic surfactants include those with molecular structures comprising (1) at least one hydrophobic moiety, such as $C_6$-$C_{20}$ alkyl, alkylaryl, and/or alkenyl groups, (2) at least one anionic group, such as sulfate, sulfonate, phosphate, polyoxyethylene sulfate, polyoxyethylene sulfonate, polyoxyethylene phosphate, and the like, and/or (3) the salts of such anionic groups, wherein said salts include alkali metal salts, ammonium salts, tertiary amino salts, and the like. Representative commercial examples of useful anionic surfactants include sodium lauryl sulfate (available, for example, under the trade designations "TEXAPON L-100" from Henkel Inc., Wilmington, Del.; and "POLYSTEP B-3" from Stepan Chemical Co, Northfield, Ill.); sodium lauryl ether sulfate (available, for example, under the trade designation "POLYSTEP B-12" from Stepan Chemical Co., Northfield, Ill.); ammonium lauryl sulfate (available, for example, under the trade designation "STANDAPOL A" from Henkel Inc., Wilmington, Del.); and sodium dodecyl benzene sulfonate (available, for example, under the trade designation "SIPONATE DS-10" from Rhone-Poulenc, Inc., Cranberry, N.J.). For typical concentrations of silica nanoparticles (e.g., 0.2 to 15 percent by weight relative to the total coating composition) most surfactants comprise less than 0.1 percent by weight of the coating composition, preferably 0.003 to 0.05 percent by weight.

Exemplary wetting agents include polyethoxylated alkyl alcohols (available, for example, under the trade designations "BRIJ 30" and "BRIJ 35 from ICI Americas, Inc.; and "TERGITOL TMN-6" SPECIALTY SURFACTANT" from Union Carbide Chemical and Plastics Co.), polyethoxylated alkylphenols (available, for example, under the trade designations, "TRITON X-100" from Union Carbide Chemical and Plastics Co., "ICONOL NP-70" from BASF Corp., Florham Park, N.J.); and polyethylene glycol/polypropylene glycol block copolymer (available, for example, under the trade designations "TETRONIC 1502 BLOCK COPOLYMER SURFACTANT", "TETRONIC 908 BLOCK COPOLYMER SURFACTANT", and "PLURONIC F38 BLOCK COPOLYMER SURFACTANT" from BASF Corp.). Generally the wetting agent is used in amounts of less than 0.1 percent by weight of the coating composition, preferably 0.003 to 0.05 percent by weight of the coating composition depending on the amount of silica nanoparticles. Rinsing or steeping the coated article in water may be desirable to remove excess surfactant or wetting agent.

In some embodiments, the nanoparticles for the article, as well as the coating composition, have average particle diameters up to 500 nanometers, 400 nanometers, 300 nanometers, 200 nanometers, 150 nanometers, 100 nanometers, 75 nanometers, 50 nanometers, 40 nanometers, 30 nanometers, or even up to 20 nanometers.

In some embodiments, the nanoparticles for the article, as well as the coating composition, have a bi-modal distribution. In some embodiments, the bi-modal distribution of nanoparticles has a first distribution in a range from 2 nanometers to 15 nanometers and a second distribution in a range from 20 nanometers to 500 nanometers; a first distribution in a range from 2 nanometers to 20 nanometers and a second distribution in a range from 30 nanometers to 500 nanometers or even a first distribution in a range from 5 nanometers to 15 nanometers and a second distribution in a range from 20 nanometers to 100 nanometers. In another aspect, in some embodiments, the weight ratio of the first distribution of nanoparticles to the second distribution of nanoparticles is in a range from 1:99 to 99:1; 10:90 to 90:10; 20:80 to 80:20; or even 30:70 to 70:30.

Techniques for applying the coating composition include using a rolling coating, spray coating, curtain coating, dip coating, and air knife.

In some embodiments, it may be desirable to corona or flame treat the substrate using techniques known in the art to modify the surface energy to enhance wettability of the surface to be coated with the coating composition.

In some embodiments, the sintered coating is a conformal coating relative to the anti-reflective, structured surface of a transparent substrate. The corona or flame treatment of the surface to be coated with the coating composition can aid in obtaining a conformal coating.

In some embodiments, the sintered coating has higher light transmission over a wider range of incident light angles than the surface structure itself. Although not wanting to be bound by theory, it is believed that porous nanosilica provides additional anti-reflection by gradient refractive index (porosity is higher at the surface). Further, it is believed that incident light angles beyond critical angle of prism slope will have increased light transmission from reflection reduction provided by gradient refractive index porous nanosilica coating.

Dirt and dust particles that do accumulate on the antireflective, structured surfaces described herein comprising the silica nanoparticles is relatively easy to clean.

Figure 4:
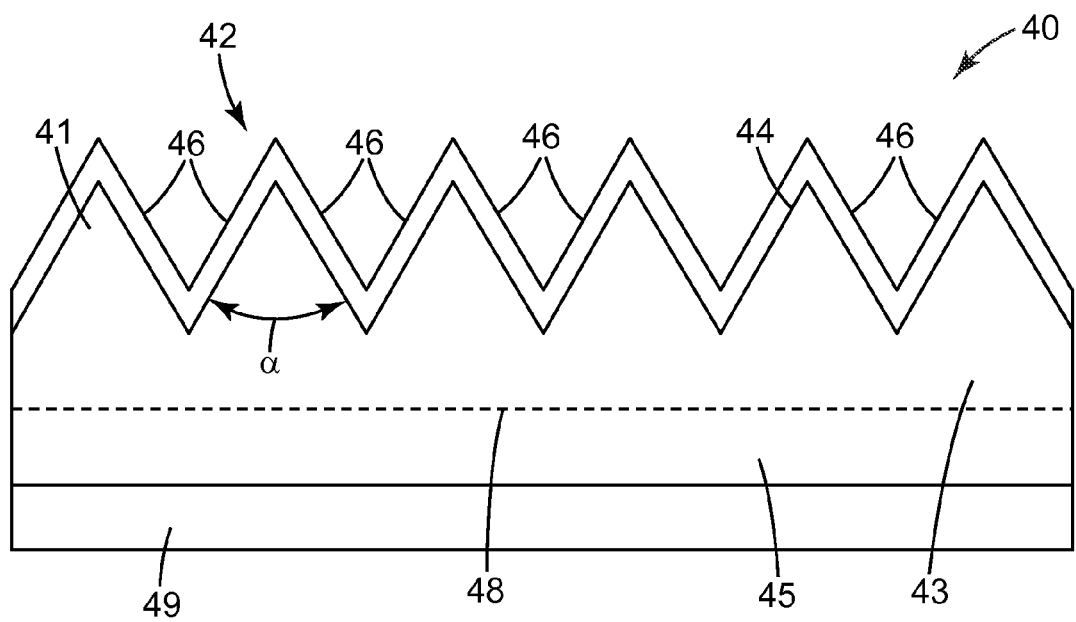
FIG. 4 is an exemplary schematic of a silica nanoparticle coating on antireflective surface structure on a UV stable substrate.

Referring to FIG. 4, exemplary transparent structured surface film 40 comprises structured film substrate 43 having major structured face 42 with structured surfaces in the form of prismatic riblets 41. Each structured surface 41 has tip angle α that is less than 90 degrees. Film 40 also has base portion 45 from which structured surfaces 41 extend. Base portion 45 can be an integrally formed part of the structures 41 as illustrated, or a separate layer as indicated by dashed line 48. Structured face 44 is additionally coated with silica nanoparticles 46 on surface 44, which can be sintered. Support backing 45 can be, for example, polymeric material, a glass, or other transparent ceramic material. Exemplary polymeric materials may include at least one or a combination of a polymethyl methacrylate (PMMA) film, polyvinylidene fluoride (PVDF) film, PMMA/PVDF/UVA blend film, polyethylene terephthalate (PET) film, primed PET film, polycarbonate film, tri-layer polycarbonate film with PMMA/PVDF/UVA blend skins, cross-linked polyurethane film, acrylate film, fluorinated ethylene-propylene (FEP) film, or UV mirror film. Optional adhesive layer 49 is opposite structured surface face 44.

Figure 5:
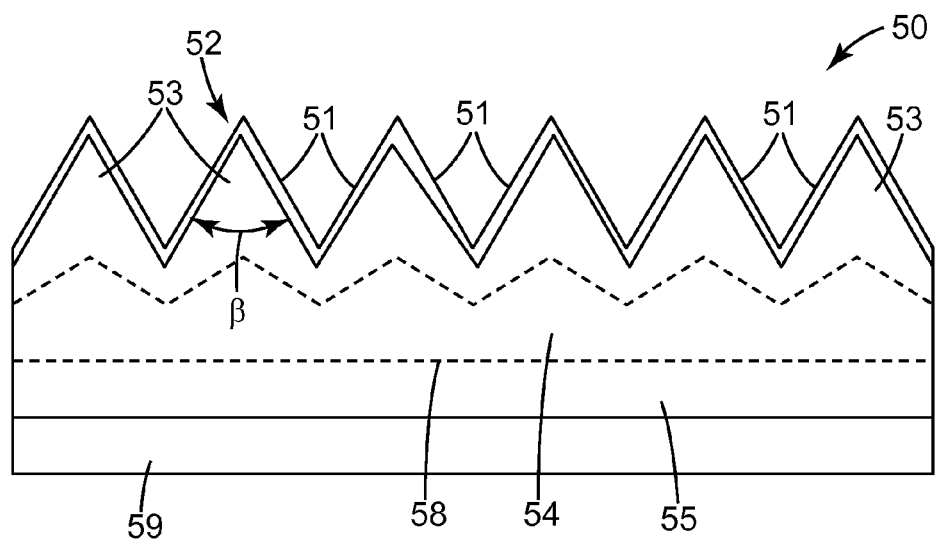
FIG. 5 is an exemplary schematic of a silica nanoparticle coating on antireflective surface structure that has a crosslinked gradient.

Referring to FIG. 5, exemplary transparent structured surface film 50 has structured film substrate 55 that has major structured face 52 with structured surfaces in the form of prismatic riblets 53. Each structured surface 53 has tip angle β that is less than 90 degrees. The film 50 further comprises a base portion 54 from which structured surfaces 53 extend. Base portion 55 can be an integrally formed part of structures 53 as illustrated, or a separate layer as indicated by dashed line 58. Structured face 53 is exposed to an additional cross-linking treatment (e.g., e-beam radiation or heat energy) such that each structured surface 53 has a polymer cross-link density that is higher than a core or otherwise remainder 54 of structured film substrate 54. The depth of the higher cross-link density depends, for example, on the exposure intensity and/or duration of the additional cross-linking treatment. Higher cross-link density of structured surface 53 has been observed to result in an increased resistance to dirt and dust particle pick-up. It is desirable for film 50, or any other structured surface film described herein, to comprise coating of porous silica nanoparticles 51 on surface 53, which can be sintered. Support backing 55 can comprise, for example, a polymeric material or a glass or other transparent ceramic material. Exemplary polymeric materials may include at least one or a combination of a polymethyl methacrylate (PMMA) film, polyvinylidene fluoride (PVDF) film, PMMA/PVDF/UVA blend film, polyethylene terephthalate (PET) film, primed PET film, polycarbonate film, tri-layer polycarbonate film with PMMA/PVDF/UVA blend skins, cross-linked polyurethane film, acrylate film, fluorinated ethylene-propylene (FEP) film, or UV mirror film. Optional adhesive layer 59 is opposite structured surface face 53.

Figure 6:
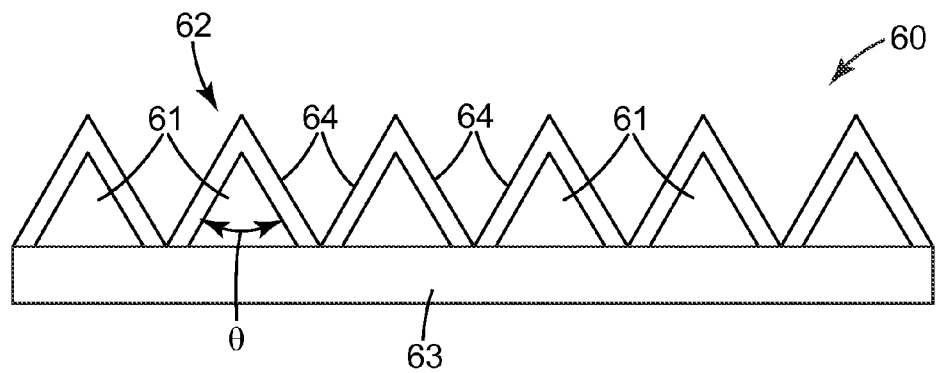
FIG. 6 is an exemplary schematic of a silica nanoparticle coating on antireflective surface structure with prisms on a UV stable substrate.

Referring to FIG. 6, exemplary transparent structured surface film 60 has structured film substrate 63 that has major structured face 62 with structured surfaces in the form of prismatic riblets 61. Each structured surface 61 has a tip angle θ that is less than 90 degrees. Film 60 also has base portion 63 from which structured surfaces 61 extend. Structured face 61 is additionally coated with porous silica nanoparticles 64 on surface 61, which can be sintered. Support backing 63 can comprise, for example, a polymeric material or a glass or other transparent ceramic material. Exemplary polymeric materials may include at least one or a combination of a polymethyl methacrylate (PMMA) film, polyvinylidene fluoride (PVDF) film, PMMA/PVDF/UVA blend film, polyethylene terephthalate (PET) film, primed PET film, polycarbonate film, tri-layer polycarbonate film with PMMA/PVDF/UVA blend skins, cross-linked polyurethane film, acrylate film, fluorinated ethylene-propylene (FEP) film, or UV mirror film.

Figure 7:
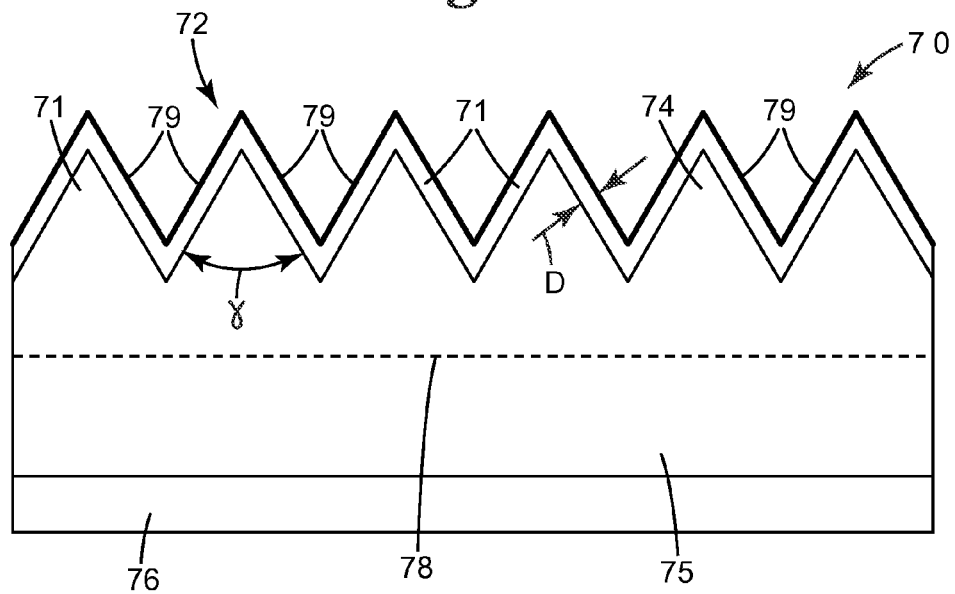
FIG. 7 is an exemplary schematic of a silica nanoparticle coating on antireflective surface structure on a UV stable substrate.

Referring to FIG. 7, exemplary transparent structured surface film 70 has structured film substrate 75 having major structured face 72 with structured surfaces in the form of prismatic riblets 71. Each structured surface 71 has a tip angle γ that is less than 90 degrees. Film 70 also has base portion 75 from which structured surfaces 71 extend. Base portion 75 can be an integrally formed part of the structures 71 as illustrated, or a separate layer as indicated by dashed line 78. Structured face 71 is exposed to an additional cross-linking treatment (e.g., e-beam radiation or heat energy) such that each structured surface 71 has a polymer cross-link density that is higher than a core or otherwise remainder 74 of structured film substrate 74. The depth, D, of the higher cross-link density depends on the exposure intensity and/or duration of the additional cross-linking treatment. The higher cross-link density of structured surface 71 has been observed to result in an increased resistance to dirt and dust particle pick-up, as well as an increase in the abrasion resistance. Film 70, or any other structured surface film described herein, has coating of porous silica nanoparticles 79 on surface 71, which can be sintered. Support backing 75 can comprise, for example, a polymeric material or a glass or other transparent ceramic material. Exemplary polymeric materials may include at least one or a combination of a polymethyl methacrylate (PMMA) film, polyvinylidene fluoride (PVDF) film, PMMA/PVDF/UVA blend film, polyethylene terephthalate (PET) film, primed PET film, polycarbonate film, tri-layer polycarbonate film with PMMA/PVDF/UVA blend skins, cross-linked polyurethane film, acrylate film, fluorinated ethylene-propylene (FEP) film, or UV mirror film. Optional adhesive layer 76 is opposite structured surface face 71.

Figure 8:
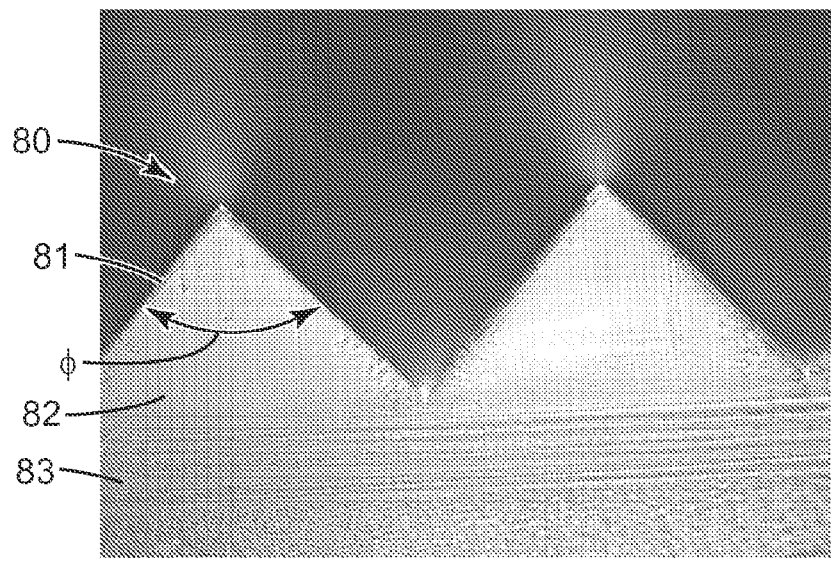
FIG. 8 is a camera digital image of a cross-section of exemplary acid sintered silica nanoparticles coated on anti-reflective surface structure.

FIG. 8 is camera digital image of a cross-section of exemplary acid sintered silica nanoparticles coated on antireflective surface structure 80. Transparent structured surface film substrate 83 has structured surface prisms 82 with tip angle φ of less than 90 degrees. The face of each prism is coated with layer 81 of porous silica. Support backing 83 and structured surface 82 may comprise, for example, PMMA.

Figure 9:
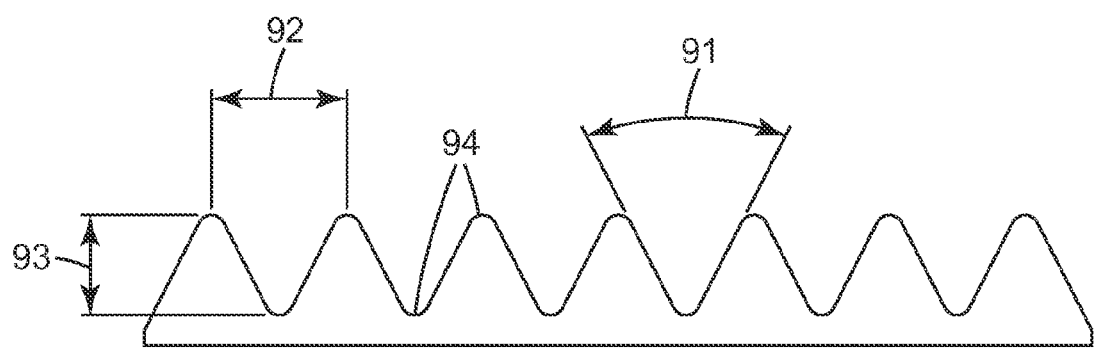
FIG. 9 is an exemplary schematic of geometry of antireflective surface structure.

FIG. 9 illustrates exemplary rounded riblet prism surface structure geometry with increased resistance to dirt build-up and abrasion by blowing sand. Each structured surface has an apex angle 91 of less than 90 degrees. Structured surfaces are typically having pitch 92 not more than 1 mm apart. Peak to valley height 93 is typically not more than 1 mm Peak and/or valley radii 94 is typically at least1 micrometer.

As some embodiments of articles described herein are used in outdoor applications, weathering is a desirable characteristic of the article. Accelerated weathering studies are one option for evaluating the performance of the article. Accelerated weathering studies can be performed on films, for example, using techniques similar to those described in ASTM G-155-05a (October 2005), "Standard practice for exposing non-metallic materials in accelerated test devices that use laboratory light sources", the disclosure of which is incorporated herein by reference.

In some embodiments, the film exhibits a change in light transmission of less than 8%, after the structured surface is exposed to the following Dirt Pick-Up Test.

Dirt Pick-Up Test

Coating soiling resistance is tested using an apparatus constructed from a 95 mm square plastic petri dish (available under the trade designation "FALCON 35112" from Becton Dickinson Labware, Franklin Lakes, N.J.) with a 5 cm hole drilled through bottom half of the petri dish. A 5 cm by 8 cm coated sample is attached with adhesive tape on the outside of the petri-dish covering the 5 cm hole so that the coated surface of the sample is facing the inside of the petri dish and is exposed directly to the test dirt. 50 grams of Arizona Test Dust (0-600 micrometer distribution; available from Powder Technology Incorporated, Burnsville, Minn.) is placed into the bottom half of the petri dish covering the coated samples. The two halves of the petri dish are combined securely and shaken lightly in side-to-side cycles so that the dirt tumbles back and forth over the surface of the sample. The sample is shaken side-to-side by hand for 60 cycles at a rate of 1 cycle per second. The sample is then removed from the testing apparatus and gently tapped to remove and loosely attached dirt. The transmittance of the coated sample is measured before and after the dirt test using a hazemeter (available under the trade designation "HAZE GARD PLUS" from BYK-Gardner, Columbia, Md.). After the dirt test the sample is gently rinsed under water to remove dirt and dried, the transmittance is measured again as measure of cleanability.

In some embodiments, the film exhibits a change in light transmission of less than 8%, after the structured surface is exposed to the following Falling Sand Test.

Falling Sand Test

Coating abrasion resistance is tested using a falling sand abrasion tester (available under the trade designation "HP-1160" from Humboldt MFG. Co., Norridge, Ill.). A 5 cm by 8 cm coated sample is attached with adhesive tape to the testing platform centered underneath the outlet of the falling sand tube. 1000 grams of ASTM C778 silica sand (available from U.S. Silica Company, Ottawa, Ill.) is loaded into the hopper that feeds the falling sand tube. The gate is opened and the sand begins to fall a distance of 100 cm through the falling sand tube and impinges on the surface of the coated sample. The transmittance of the coated samples is measured before and after the falling sand test using a hazemeter ("HAZE GARD PLUS"). After the falling sand test the sample is also gently rinsed under water to remove debris and is dried and transmittance is measured again.

Some embodiments of articles described herein can be combined with a transparent support backing having a major face, wherein the transparent support backing dissipates static electricity, and the structured substrate further comprises a backing face bonded to the major face of the support backing so as to form a reinforced anti-reflective structured article. The transparent support backing can also be chosen so as to dissipate static electricity (e.g., the support backing can comprise a polymeric material(s) that enable the support backing to dissipate static electricity. For example, the transparent support backing may also comprise an inherently static dissipative polymer such as a polyurethane (available, for example, under the trade designation "STATRITE X5091" from Lubrizol Corp., Wickliffe, Ohio), a polymethyl metacrylate (available, for example, under the trade designation "STATRITE M809" from Lubrizol Corp.), or PMMA (available, for example, under the trade designation "PERMASTAT" from RTP, Winona, Minn.), as well as static dissipative salts (available, for example, under the trade designation "FC4400" from 3M Company, St. Paul, Minn.) which be blended into the polymer used to make the transparent support backing (e.g., polyvinylidene fluoride (PVDF)). In addition, or alternatively, the structured film substrate can comprise such static dissipative salts.

Instead of, or in addition to, the support backing, it may also be desirable for the film, or any other transparent anti-reflective structured film described herein, to be used in combination with an optional moisture barrier layer. In such an embodiment, the moisture barrier layer can be formed, for example, by laminating, coating or otherwise bonding the moisture resistant barrier layer indirectly through one or more intermediate layers (e.g., the support backing layer) or directly onto the major backing face of the structured film substrate. Alternatively, the moisture barrier layer can be formed by formulating the composition of the film so as to exhibit moisture barrier properties (e.g., so as to inhibit moisture absorption, permeation, etc.).

The moisture barrier may be, for example, a barrier assembly a barrier layer(s) disclosed in U.S. Pat. No. 7,486,019 (Padiyath et. al.) and U.S. Pat. No. 7,215,473 (Fleming), Published U.S. Patent Application No. US 2006/0062937 A1, and International Patent Application No. PCT/US2009/062944, the disclosures of which are incorporated herein by reference. A moisture barrier may be useful, because silicone has a high moisture vapor transmission rate and photovoltaic cells are typically moisture sensitive. Therefore, by being backed with a moisture barrier layer, a transparent anti-reflective structured film of the invention can be used directly on moisture sensitive photovoltaic cells (e.g., Copper/Indium/Gallium/Selenium or CIGS photovoltaic cells).

Barrier films useful for practicing the present disclosure can be selected from a variety of constructions. Barrier films are typically selected such that they have oxygen and water transmission rates at a specified level as required by the application. In some embodiments, the barrier film has a water vapor transmission rate (WVTR) less than about $0.005$ $g/m^2/day$ at $38°$ C. and 100% relative humidity; in some embodiments, less than about $0.0005$ $g/m^2/day$ at $38°$ C. and 100% relative humidity; and in some embodiments, less than about $0.00005$ $g/m^2/day$ at $38°$ C. and 100% relative humidity. In some embodiments, the flexible barrier film has a WVTR of less than about $0.05$, $0.005$, $0.0005$, or $0.00005$ $g/m^2/day$ at $50°$ C. and 100% relative humidity or even less than about $0.005$, $0.0005$, $0.00005$ $g/m^2/day$ at $85°$ C. and 100% relative humidity. In some embodiments, the barrier film has an oxygen transmission rate of less than about $0.005$ $g/m^2/day$ at $23°$ C. and 90% relative humidity; in some embodiments, less than about $0.0005$ $g/m^2/day$ at $23°$ C. and 90% relative humidity; and in some embodiments, less than about $0.00005$ $g/m^2/day$ at $23°$ C. and 90% relative humidity.

Exemplary useful barrier films include inorganic films prepared by atomic layer deposition, thermal evaporation, sputtering, and chemical vapor deposition. Useful barrier films are typically flexible and transparent.

In some embodiments, useful barrier films comprise inorganic/organic multilayers. Flexible ultra-barrier films comprising inorganic/organic multilayers are described, for example, in U.S. Pat. No. 7,018,713 (Padiyath et al.). Such flexible ultra-barrier films may have a first polymer layer disposed on polymeric film substrate that is overcoated with two or more inorganic barrier layers separated by at least one second polymer layer. In some embodiments, the barrier film comprises one inorganic barrier layer interposed between the first polymer layer disposed on the polymeric film substrate and a second polymer layer.

The first and second polymer layers can independently be formed by applying a layer of a monomer or oligomer and crosslinking the layer to form the polymer in situ, for example, by flash evaporation and vapor deposition of a radiation-crosslinkable monomer followed by crosslinking, for example, using an electron beam apparatus, UV light source, electrical discharge apparatus or other suitable device. The first polymer layer is applied to the polymeric film substrate, and the second polymer layer is typically applied to the inorganic barrier layer. The materials and methods useful for forming the first and second polymer layers may be independently selected to be the same or different. Useful techniques for flash evaporation and vapor deposition followed by crosslinking in situ can be found, for example, in U.S. Pat.

No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in published PCT Application No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996). In some embodiments, the polymer layers and inorganic barrier layer are sequentially deposited in a single pass vacuum coating operation with no interruption to the coating process.

The coating efficiency of the first polymer layer can be improved, for example, by cooling the polymeric film substrate. Similar techniques can also be used to improve the coating efficiency of the second polymer layer. The monomer or oligomer useful for forming the first and/or second polymer layers can also be applied using conventional coating methods such as roll coating (e.g., gravure roll coating) or spray coating (e.g., electrostatic spray coating). The first and/or second polymer layers can also be formed by applying a layer containing an oligomer or polymer in solvent and then removing the solvent using conventional techniques (e.g., at least one of heat or vacuum). Plasma polymerization may also be employed.

Volatilizable acrylate and methacrylate monomers are useful for forming the first and second polymer layers. In some embodiments, volatilizable acrylates are used. Volatilizable acrylate and methacrylate monomers may have a molecular weight in the range from about 150 to about 600 grams per mole, or, in some embodiments, from about 200 to about 400 grams per mole. In some embodiments, volatilizable acrylate and methacrylate monomers have a value of the ratio of the molecular weight to the number of (meth)acrylate functional groups per molecule in the range from about 150 to about 600 g/mole/(meth)acrylate group, in some embodiments, from about 200 to about 400 g/mole/(meth)acrylate group. Fluorinated acrylates and methacrylates can be used at higher molecular weight ranges or ratios, for example, about 400 to about 3000 molecular weight or about 400 to about 3000 g/mole/(meth)acrylate group. Exemplary useful volatilizable acrylates and methacrylates include hexanediol diacrylate, ethoxyethyl acrylate, phenoxyethyl acrylate, cyanoethyl (mono)acrylate, isobornyl acrylate, isobornyl methacrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl(meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, tris(2-hydroxyethyl)isocyanurate triacrylate, pentaerythritol triacrylate, phenylthioethyl acrylate, naphthloxyethyl acrylate, cyclic diacrylates (available, for example, under the trade designation "EB-130" from Cytec Industries Inc.) and tricyclodecane dimethanol diacrylate (available, for example, under the trade designation "SR833S" from Sartomer Co., Exton, Pa.), epoxy acrylate (available, for example, under the trade designation "RDX80095" from Cytec Industries Inc.), and mixtures thereof.

Useful monomers for forming the first and second polymer layers are available from a variety of commercial sources and include urethane acrylates (available, for example, under the trade designations "CN-968" and "CN-983" from Sartomer Co.), isobornyl acrylate (available, for example, under the trade designation "SR-506" from Sartomer Co.), dipentaerythritol pentaacrylates (available, for example, under the trade designation "SR-399" from Sartomer Co.), epoxy acrylates blended with styrene (available, for example, under the trade designation "CN-120S80" from Sartomer Co.), di-trimethylolpropane tetraacrylates (available, for example, under the trade designation "SR-355" from Sartomer Co.), diethylene glycol diacrylates (available, for example, under the trade designation "SR-230" from Sartomer Co.), 1,3-butylene glycol diacrylate (available, for example, under the trade designation "SR-212" from Sartomer Co.), pentaacrylate esters (available, for example, under the trade designation "SR-9041" from Sartomer Co.), pentaerythritol tetraacrylates (available, for example, under the trade designation "SR-295" from Sartomer Co.), pentaerythritol triacrylates (available, for example, under the trade designation "SR-444" from Sartomer Co.), ethoxylated (3)trimethylolpropane triacrylates (available, for example, under the trade designation "SR-454" from Sartomer Co.), ethoxylated (3)trimethylolpropane triacrylates (available, for example, under the trade designation "SR-454HP" from Sartomer Co.), alkoxylated trifunctional acrylate esters (available, for example, under the trade designation "SR-9008" from Sartomer Co.), dipropylene glycol diacrylates (available, for example, under the trade designation "SR-508" from Sartomer Co.), neopentyl glycol diacrylates (available, for example, under the trade designation "SR-247" from Sartomer Co.), ethoxylated (4)bisphenol a dimethacrylates (available, for example, under the trade designation "CD-450" from Sartomer Co.), cyclohexane dimethanol diacrylate esters (e available, for example, under the trade designation "CD-406" from Sartomer Co.), isobornyl methacrylate (available, for example, under the trade designation "SR-423" from Sartomer Co.), cyclic diacrylates (available, for example, under the trade designation "IRR-214" from Sartomer Co.) and tris(2-hydroxy ethyl) isocyanurate triacrylate available, for example, under the trade designation "SR-368" from Sartomer Co.), acrylates of the foregoing methacrylates and methacrylates of the foregoing acrylates.

Other monomers that are useful for forming the first and/or second polymer layers include vinyl ethers, vinyl naphthylene, acrylonitrile, and mixtures thereof.

The desired chemical composition and thickness of the first polymer layer will depend in part on the nature and surface topography of the polymeric film substrate. The thickness of the first and/or second polymer layers will typically be sufficient to provide a smooth, defect-free surface to which inorganic barrier layer can be applied subsequently. For example, the first polymer layer may have a thickness of a few nm (for example, 2 or 3 nm) to about 5 micrometers or more. The thickness of the second polymer layer may also be in this range and may, in some embodiments, be thinner than the first polymer layer.

Visible light-transmissive inorganic barrier layer can be formed from a variety of materials. Useful materials include metals, metal oxides, metal nitrides, metal carbides, metal oxynitrides, metal oxyborides, and combinations thereof. Exemplary metal oxides include silicon oxides such as silica, aluminum oxides such as alumina, titanium oxides such as titania, indium oxides, tin oxides, indium tin oxide (ITO), tantalum oxide, zirconium oxide, niobium oxide, and combinations thereof. Other exemplary materials include boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. In some embodiments, the visible light-transmissive inorganic barrier layer comprises at least one of ITO, silicon oxide, or aluminum oxide. In some embodiments, with the proper selection of the relative proportions of each elemental constituent, ITO can be electrically conductive. The inorganic barrier layers can be formed, for example, using techniques employed in the film metallizing art such as sputtering (e.g., cathode or planar magnetron sputtering, dual AC planar magnetron sputtering or dual AC rotatable magnetron sputtering), evaporation (e.g., resistive or electron beam evaporation and energy enhanced analogs of resistive or electron beam evaporation including ion beam and plasma assisted deposition), chemical vapor deposition, plasma-enhanced chemical vapor deposition, and plating. In some embodiments, the inorganic barrier layers are formed using sputtering (e.g., reactive sputtering). Enhanced barrier properties may be observed when the inorganic layer is formed by a high energy deposition technique such as sputtering compared to lower energy techniques such as conventional vapor deposition processes. Without being bound by theory, it is believed that the enhanced properties are due to the condensing species arriving at the substrate with greater kinetic energy, leading to a lower void fraction as a result of compaction.

The desired chemical composition and thickness of each inorganic barrier layer will depend in part on the nature and surface topography of the underlying layer and on the desired optical properties for the barrier film. The inorganic barrier layers typically are sufficiently thick so as to be continuous, and sufficiently thin so as to ensure that the barrier films and assemblies disclosed herein will have the desired degree of visible light transmission and flexibility. The physical thickness (as opposed to the optical thickness) of each inorganic barrier layer may be, for example, about 3 nm to about 150 nm (in some embodiments, about 4 nm to about 75 nm). The term "visible light-transmissive" as used herein to described the inorganic barrier layer can mean having an average transmission over the visible portion of the spectrum of at least about 75% (in some embodiments at least about 80, 85, 90, 92, 95, 97, or 98%) measured along the normal axis. In some embodiments, the inorganic barrier layer has an average transmission over a range of 400 nm to 800 nm of at least about 75% (in some embodiments at least about 80, 85, 90, 92, 95, 97, or 98%). Visible light-transmissive inorganic barrier layers are those that do not interfere with absorption of visible light, for example, by photovoltaic cells.

Additional inorganic barrier layers and polymer layers can be present if desired. In embodiments wherein more than one inorganic barrier layer is present, the inorganic barrier layers do not have to be the same or have the same thickness. When more than one inorganic barrier layer is present, the inorganic barrier layers can respectively be referred to as the "first inorganic barrier layer" and "second inorganic barrier layer". Additional "polymer layers" may be present in between additional inorganic barrier layers. For example, the barrier film may have several alternating inorganic barrier layers and polymer layers. Each unit of inorganic barrier layer combined with a polymer layer is referred to as a dyad, and the barrier film can include any number of dyads. It can also include various types of optional layers between the dyads.

Surface treatments or tie layers can be applied between any of the polymer layers or inorganic barrier layers, for example, to improve smoothness or adhesion. Useful surface treatments include electrical discharge in the presence of a suitable reactive or non-reactive atmosphere (e.g., plasma, glow discharge, corona discharge, dielectric barrier discharge or atmospheric pressure discharge); chemical pretreatment; or flame pretreatment. A separate adhesion promotion layer may also be formed between the major surface of the polymeric film substrate and the barrier film. The adhesion promotion layer can be, for example, a separate polymeric layer or a metal-containing layer such as a layer of metal, metal oxide, metal nitride or metal oxynitride. The adhesion promotion layer may have a thickness of a few nanometers (nm) (e.g., 1 or 2 nm) to about 50 nm or more.

In some embodiments, useful barrier films comprise plasma deposited polymer layers (for example, diamond-like layers) such as those disclosed in U.S. Pat. App. Pub. No. 2007-0020451 (Padiyath et al.). For example, barrier films can be made by overcoating a first polymer layer on the flexible visible-light transmissive substrate, and a plasma deposited polymer layer overcoated on the first polymer layer. The first polymer layer may be as described in any of the above embodiments of the first polymer layer. The plasma deposited polymer layer may be, for example, a diamond-like carbon layer or a diamond-like glass. The term "overcoated" to describe the position of a layer with respect to a substrate or other element of a barrier film, refers to the layer as being atop the substrate or other element, but not necessarily contiguous to either the substrate or the other element. The term "diamond-like glass" (DLG) refers to substantially or completely amorphous glass including carbon and silicon, and optionally including one or more additional components selected from the group including hydrogen, nitrogen, oxygen, fluorine, sulfur, titanium, and copper. Other elements may be present in certain embodiments. The amorphous diamond-like glass films may contain clustering of atoms to give it a short-range order but are essentially devoid of medium and long range ordering that lead to micro or macro crystallinity, which can adversely scatter radiation having wavelengths of from 180 nm to 800 nm. The term "diamond-like carbon" (DLC) refers to an amorphous film or coating comprising approximately 50 to 90 atomic percent carbon and approximately 10 to 50 atomic percent hydrogen, with a gram atom density of between approximately 0.20 and approximately 0.28 gram atoms per cubic centimeter, and composed of approximately 50% to approximately 90% tetrahedral bonds.

In some embodiments, the barrier film can have multiple layers made from alternating DLG or DLC layers and polymer layers (e.g., first and second polymer layers as described above) overcoated on the flexible, visible-light transmissive substrate. Each unit including a combination of a polymer layer and a DLG or DLC layer is referred to as a dyad, and the assembly can include any number of dyads. It can also include various types of optional layers between the dyads. Adding more layers in the barrier film may increase its imperviousness to oxygen, moisture, or other contaminants and may also help cover or encapsulate defects within the layers.

In some embodiments, the diamond-like glass comprises, on a hydrogen-free basis, at least 30% carbon, a substantial amount of silicon (typically at least 25%) and no more than 45% oxygen. The unique combination of a fairly high amount of silicon with a significant amount of oxygen and a substantial amount of carbon makes these films highly transparent and flexible. Diamond-like glass thin films may have a variety of light transmissive properties. Depending upon the composition, the thin films may have increased transmissive properties at various frequencies. However, in some embodiments, the thin film (when approximately one micron thick) is at least 70% transmissive to radiation at substantially all wavelengths from about 250 nm to about 800 nm (e.g., 400 nm to about 800 nm). A transmission of 70% for a one micron thick film corresponds to an extinction coefficient (k) of less than 0.02 in the visible wavelength range between 400 nm and 800 nm.

In creating a diamond-like glass film, various additional components can be incorporated to alter and enhance the properties that the diamond-like glass film imparts to the substrate (for example, barrier and surface properties). The additional components may include one or more of hydrogen, nitrogen, fluorine, sulfur, titanium, or copper. Other additional components may also be of benefit. The addition of hydrogen promotes the formation of tetrahedral bonds. The addition of fluorine may enhance barrier and surface properties of the diamond-like glass film, including the ability to be dispersed in an incompatible matrix. Sources of fluorine include compounds such as carbon tetrafluoride ($CF_4$), sulfur hexafluoride ($SF_6$), $C_2F_6$, $C_3F_8$, and $C_4F_{10}$. The addition of nitrogen may be used to enhance resistance to oxidation and to increase electrical conductivity. Sources of nitrogen include nitrogen gas ($N_2$), ammonia ($NH_3$), and hydrazine ($N_2H_6$). The addition of sulfur can enhance adhesion. The addition of titanium tends to enhance adhesion and diffusion and barrier properties.

Various additives to the DLC film can be used. In addition to nitrogen or fluorine, which may be added for the reasons described above with regard to diamond-like glass, oxygen and silicon may be added. The addition of silicon and oxygen to the DLC coating tend to improve the optical transparency and thermal stability of the coating. Sources of oxygen include oxygen gas ($O_2$), water vapor, ethanol, and hydrogen peroxide. Sources of silicon preferably include silanes such as $SiH_4$, $Si_2H_6$, and hexamethyldisiloxane.

Additives to DLG or DLC films described above may be incorporated into the diamond-like matrix or attached to the surface atomic layer. If the additives are incorporated into the diamond-like matrix they may cause perturbations in the density and/or structure, but the resulting material is essentially a densely packed network with diamond-like carbon characteristics (e.g., chemical inertness, hardness, and barrier properties). If the additive concentration is too large (e.g., greater than 50 atomic percent relative to the carbon concentration) the density will be affected and the beneficial properties of the diamond-like carbon network will be lost. If the additives are attached to the surface atomic layers they will alter only the surface structure and properties. The bulk properties of the diamond-like carbon network will be preserved.

Plasma deposited polymers such as diamond-like glass and diamond-like carbon can be synthesized from a plasma by using precursor monomers in the gas phase at low temperatures. Precursor molecules are broken down by energetic electrons present in the plasma to form free radical species. These free radical species react at the substrate surface and lead to polymeric thin film growth. Due to the non-specificity of the reaction processes in both the gas phase and the substrate, the resulting polymer films are typically highly cross-linked and amorphous in nature. For additional information regarding plasma deposited polymers, see, for example, H. Yasuda, "Plasma Polymerization," Academic Press Inc., New York (1985); R. d'Agostino (Ed), "Plasma Deposition, Treatment & Etching of Polymers," Academic Press, New York (1990); and H. Biederman and Y. Osada, "Plasma Polymerization Processes," Elsever, New York (1992).

Typically, plasma deposited polymer layers described herein have an organic nature due to the presence of hydrocarbon and carbonaceous functional groups such as $CH_3$, $CH_2$, CH, Si—C, $S_1$—$CH_3$, Al—C, Si—O—$CH_3$, etc. The plasma deposited polymer layers are substantially sub-stoichiometric in their inorganic component and substantially carbon-rich. In films containing silicon, for example, the oxygen to silicon ratio is typically below 1.8 (silicon dioxide has a ratio of 2.0), more typically below 1.5 for DLG, and the carbon content is at least about 10%. In some embodiments, the carbon content is at least about 20% or 25%.

Amorphous diamond-like films formed via ion enhanced plasma chemical vapor deposition (PECVD) utilizing silicone oil and an optional silane source to form the plasma as described, for example, in U.S. Pat. App. Pub. No. 2008-0196664 (David et al.), can also be useful in barrier films. The terms "silicone", "silicone oil", or "siloxanes" are used interchangeably and refer to oligomeric and higher molecular weight molecules having a structural unit $R_2SiO$ in which R is independently selected from hydrogen, ($C_1$-$C_8$)alkyl, ($C_5$-$C_{18}$)aryl, ($C_6$-$C_{26}$)arylalkyl, or ($C_6$-$C_{26}$)alkylaryl. These can also be referred to as polyorganosiloxanes and include chains of alternating silicon and oxygen atoms (—O—Si—O—Si—O—) with the free valences of the silicon atoms joined usually to R groups, but may also be joined (crosslinked) to oxygen atoms and silicon atoms of a second chain, forming an extended network (high MW). In some embodiments, a siloxane source such as vaporized silicone oil is introduced in quantities such that the resulting plasma formed coatings are flexible and have high optical transmission. Any additional useful process gases, such as oxygen, nitrogen and/or ammonia, for example, can be used with the siloxane and optional silane to assist in maintaining the plasma and to modify the properties of the amorphous diamond-like film layers.

In some embodiments, combinations of two or more different plasma deposited polymers can be used. For example, different plasma deposited polymer layers formed by changing or pulsing the process gases that form the plasma for depositing the polymer layer. In another example, a first layer of a first amorphous diamond-like film can be formed and then a second layer of a second amorphous diamond-like film can be formed on the first layer, where the first layer has a different composition than the second layer. In some embodiments, a first amorphous diamond-like film layer is formed from a silicone oil plasma and then a second amorphous diamond-like film layer is formed from a silicone oil and silane plasma. In other embodiments, two or more amorphous diamond-like films layers of alternating composition are formed to create the amorphous diamond-like film.

Plasma deposited polymers such as diamond-like glass and diamond-like carbon can be any useful thickness. In some embodiments, the plasma deposited polymer can have a thickness of at least 500 Angstroms, or at least 1,000 Angstroms. In some embodiments, the plasma deposited polymer can have a thickness in a range from 1,000 to 50,000 Angstroms, from 1,000 to 25,000 Angstroms, or from 1,000 to 10,000 Angstroms.

Other plasma deposition processes for preparing useful barrier films such as carbon-rich films, silicon-containing films, or combinations thereof are disclosed, for example, in U.S. Pat. No. 6,348,237 (Kohler et al.). Carbon-rich films may contain at least 50 atom percent carbon, and typically about 70-95 atom percent carbon, 0.1-20 atom percent nitrogen, 0.1-15 atom percent oxygen, and 0.1-40 atom percent hydrogen. Such carbon-rich films can be classified as "amorphous", "hydrogenated amorphous", "graphitic", "i-carbon", or "diamond-like", depending on their physical and chemical properties. Silicon-containing films are usually polymeric and contain in random composition silicon, carbon, hydrogen, oxygen, and nitrogen.

Carbon-rich films and silicon-containing films can be formed by means of plasma interaction with a vaporized organic material, which is normally a liquid at ambient temperature and pressure. The vaporized organic material is typically capable of condensing in a vacuum of less than about 1 Torr (130 Pa). The vapors are directed toward the flexible, visible-light transmissive substrate in a vacuum (e.g., in a conventional vacuum chamber) at a negatively charged electrode as described above for plasma polymer deposition. A plasma (e.g., an argon plasma or a carbon-rich plasma as described in U.S. Pat. No. 5,464,667 (Kohler et al.)) and at least one vaporized organic material are allowed to interact during formation of a film. The plasma is one that is capable of activating the vaporized organic material. The plasma and vaporized organic material can interact either on the surface of the substrate or before contacting the surface of the substrate. Either way, the interaction of the vaporized organic material and the plasma provides a reactive form of the organic material (for example, loss of methyl group from silicone) to enable densification of the material upon formation of the film, as a result of polymerization and/or crosslinking, for example. Significantly, the films are prepared without the need for solvents.

The formed films can be uniform multi-component films (e.g., one layer coatings produced from multiple starting materials), uniform one-component films, and/or multilayer films (e.g., alternating layers of carbon-rich material and silicone materials). For example, using a carbon-rich plasma in one stream from a first source and a vaporized high molecular weight organic liquid such as dimethylsiloxane oil in another stream from a second source, a one-pass deposition procedure may result in a multilayer construction of the film (e.g., a layer of a carbon-rich material, a layer of dimethylsiloxane that is at least partially polymerized, and an intermediate or interfacial layer of a carbon/dimethylsiloxane composite). Variations in system arrangements result in the controlled formation of uniform multi-component films or layered films with gradual or abrupt changes in properties and composition as desired. Uniform coatings of one material can also be formed from a carrier gas plasma, such as argon, and a vaporized high molecular weight organic liquid, such as dimethylsiloxane oil.

Other useful barrier films comprise films having a graded-composition barrier coating such as those described in U.S. Pat. No. 7,015,640 (Schaepkens et al.). Films having a graded-composition barrier coating can be made by depositing reaction or recombination products of reacting species onto polymeric film substrate. Varying the relative supply rates or changing the identities of the reacting species results in a coating that has a graded composition across its thickness. Suitable coating compositions are organic, inorganic, or ceramic materials. These materials are typically reaction or recombination products of reacting plasma species and are deposited onto the substrate surface. Organic coating materials typically comprise carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. Inorganic and ceramic coating materials typically comprise oxide; nitride; carbide; boride; or combinations thereof of elements of Groups IIA, IIIA, IVA, VA, VIA, VIIA, IB, and IIB; metals of Groups IIIB, IVB, and VB; and rare-earth metals. For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired coating composition. The choice of the particular reactants is within the skills of the artisans. A graded composition of the coating can be obtained by changing the compositions of the reactants fed into the reactor chamber during the deposition of reaction products to form the coating or by using overlapping deposition zones, for example, in a web process. The coating may be formed by one of many deposition techniques, such as plasma-enhanced chemical-vapor deposition (PECVD), radio-frequency plasma-enhanced chemical-vapor deposition (RFPECVD), expanding thermal-plasma chemical-vapor deposition (ETPCVD), sputtering including reactive sputtering, electron-cyclotron-resonance plasma-enhanced chemical-vapor deposition (ECRPECVD), inductively coupled plasma-enhanced chemical-vapor deposition (ICPECVD), or combinations thereof. Coating thickness is typically in the range from about 10 nm to about 10000 nm, in some embodiments from about 10 nm to about 1000 nm, and in some embodiments from about 10 nm to about 200 nm. The barrier film can have an average transmission over the visible portion of the spectrum of at least about 75% (in some embodiments at least about 80, 85, 90, 92, 95, 97, or 98%) measured along the normal axis. In some embodiments, the barrier film has an average transmission over a range of 400 nm to 800 nm of at least about 75% (in some embodiments at least about 80, 85, 90, 92, 95, 97, or 98%).

Other suitable barrier films include thin and flexible glass laminated on a polymer film, and glass deposited on a polymeric film.

Figure 10:
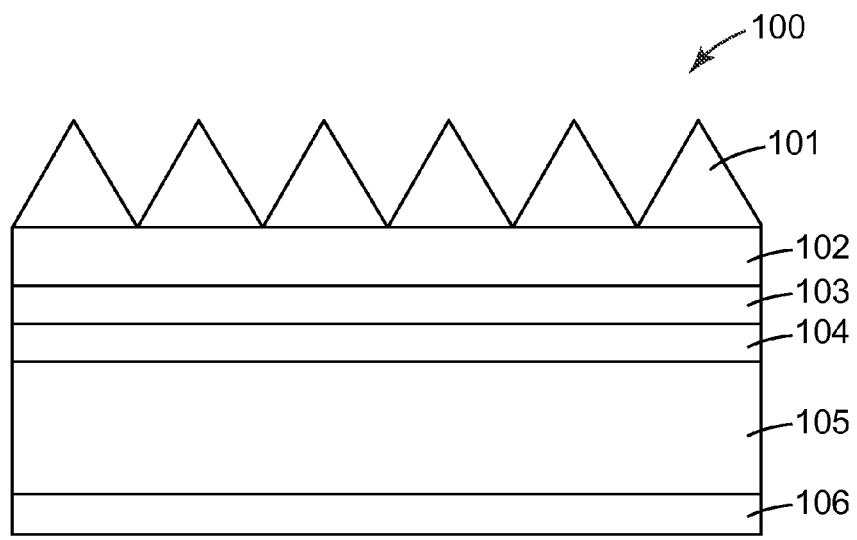
FIG. 10 is a cross-section of an exemplary flexible antireflective surface structure with a barrier layer.

Referring to FIG. 10, exemplary transparent structured surface film 100 comprises structured film substrate 102 having major structured face with structured surfaces in the form of prismatic riblets. Each structured surface has tip angle x that is less than 90 degrees. Film 100 also has base portion 103 from which structured surfaces 102 extend. Structured face of 102 is additionally coated with a layer of porous silica nanoparticles 101, which can be sintered. Support backing 103 can be, for example, transparent polymeric material. Exemplary polymeric materials may include at least one or a combination of a polymethyl(meth)acrylate (PMMA) film, polyvinylidene fluoride (PVDF) film, PMMA/PVDF/UVA blend film, polyethylene terephalate (PET) film, primed PET film, polycarbonate film, tri-layer polycarbonate film with PMMA/PVDF/UVA blend skins, cross-linked polyurethane film, acrylate film, fluorinated ethylene-propylene (FEP) film, or UV mirror film. Optically clear adhesive layer 104 is opposite structured surface face 102 and used to adhere structured surface film to dimensionally stable film 105 that has been coated with oxide barrier coating 106. Exemplary dimensionally stable films include heat stabilize PET and UV mirrors.

Figure 11:
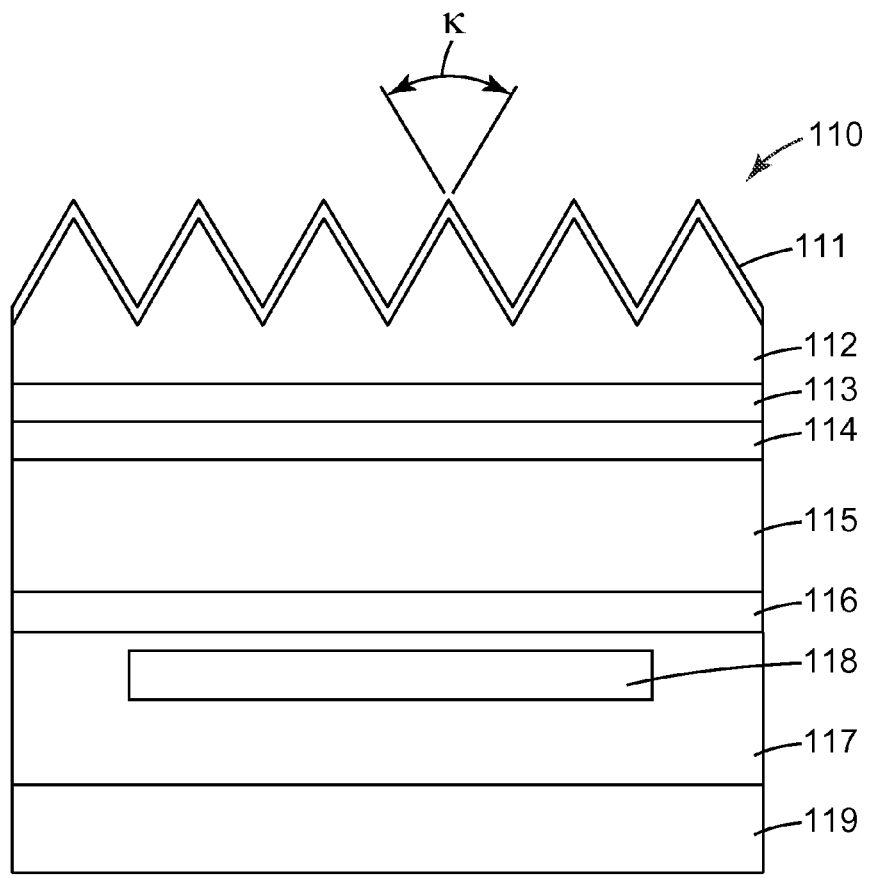
FIG. 11 is a cross-section of an exemplary flexible photovoltaic module.

Referring to FIG. 11, exemplary flexible photovoltaic module 110 comprises structured film substrate 112 having major structured face with structured surfaces in the form of prismatic riblets. Each structured surface has tip angle σ that is less than 90 degrees. Film 110 also has base portion 113 from which structured surfaces 112 extend. Structured face of 112 is additionally coated with a layer of porous silica nanoparticles 111, which can be sintered. Support backing 113 can be, for example, transparent polymeric material. Exemplary polymeric materials may include at least one or a combination of a polymethyl(meth)acrylate (PMMA) film, polyvinylidene fluoride (PVDF) film, PMMA/PVDF/UVA blend film, polyethylene terephalate (PET) film, primed PET film, polycarbonate film, tri-layer polycarbonate film with PMMA/PVDF/UVA blend skins, cross-linked polyurethane film, acrylate film, fluorinated ethylene-propylene (FEP) film, or UV mirror film. Optically clear adhesive layer 114 is opposite structured surface face 112 and used to adhere structured surface film to dimensionally stable film 115 that has been coated with oxide barrier coating 116. Exemplary dimensionally stable films include heat stabilize PET and UV mirrors. Exemplary structured surface film is laminated to a CIGS photovoltaic cell 118 with encapsulant material 117. Opposite the structured surface film is an additional barrier layer 119 which can be a metal foil or oxide barrier coated film on the back side of the flexible photovoltaic module.

Some embodiments of articles described herein can be combined with a moisture barrier layer, wherein the structured substrate further comprises a backing face, and the moisture barrier layer is bonded to the backing face of the structured substrate with, for example, an optically clear adhesive (available, for example, under the trade designation "OCA8172" from 3M Company, St. Paul, Minn.). A structured surface anti-reflection film can be modified with the addition of UVA (available, for example, under the trade designation "TINUVIN 1577" from Ciba Specialty Chemicals, Tarrytown, N.Y.) to the outer layers. The surface structured antireflection film with UV absorber can be laminated to the opposite surface of a flexible PET film (available, for example, under the trade designation "ST-505" from Dupont Teijin Films, Wilmington, Del.) coated with alternating layers of silicon aluminum oxide and acrylate polymer on one of its surfaces.

An exemplary flexible solar cell or solar module can be made, for example, using structured surface antireflection front side barrier film. Silica nanoparticle coated surface structure antireflection film construction can be laminated together with a flexible solar cell or flexible cell strings to make a flexible cell/module with enhanced reflection rejection and ultra-low (less than 0.005 g/m² day at 50° C.) water vapor transmission rates. An aluminum foil first layer with an optional dielectric layer bonded on its top surface can be laid flat on a vacuum lamination tool. On top of the surface of the aluminum foil a layer of encapsulant material, which when heated to a specified temperature will melt and flow, can be laid. A flexible solar cell or a string of flexible solar cells can be laid on top of the encapsulant and aluminum foil layers. Another layer of encapsulant can be laid on top of the solar cells/cell strings. Finally, the silica nanoparticle structured surface antireflection film can be laid on top of the last encapsulant layer. All the layers can be laminated together into a flexible solar cell or module by closing the vacuum laminator, heating and evacuating the laminator of atmospheric air for a proscribed period of time. The result is a flexible solar cell or solar module.

Solar photovoltaic modules are known in the art, and in the case of rigid photovoltaic modules (e.g., crystalline silicon modules), generally have a glass front surface. For flexible photovoltaic modules that utilize thin-film technologies, the front surface substrate is generally a UV stable polymer film (e.g., ethylene tetrafluoroethylene). Some embodiments of articles described herein can be used in light energy or solar thermal absorbing devices. For example, a light energy absorbing device could comprise a light absorber having a light energy receiving face; and an article described herein disposed so as to be between a source of light energy and the light energy receiving face, while light energy from the source is being absorbed by the light absorber. Exemplary light absorbing device include a photovoltaic device comprising a photovoltaic cell that can be wound into at least one of a roll or folded without being damaged, such as cell cracking, or cell string electrically shorting, and a rigid photovoltaic device. An exemplary solar thermal heating device comprises a thermal absorber having a first major surface, an article described herein positioned over the first major surface of the thermal absorber, and a liquid, or gas, positioned in at least one of inside the thermal absorber or between the first major surface of the thermal absorber and the article. Solar thermal absorber materials are selected to efficiently absorb solar energy, and often have low emissivity coatings so as to not reradiate thermal energy.

Solar thermal modules are known in the art and capture thermal energy by collecting the suns energy and heating a fluid. Solar thermal modules are similar to photovoltaic modules in that they are generally rigid and have a glass front surface that has at least one surface reflection, and a tendency to collect dirt. Structured surface anti-reflection films described herein can facilitate the capture of more energy by minimizing surface reflections, especially at higher incident light angles. Silica nanoparticle coatings on the structured surface anti-reflections films described herein can capture more energy by minimizing dirt attraction, increase total transmission of light into the solar thermal absorber, and thus improve its efficiency.

In some embodiments, a silica nanoparticle coating can be applied to the anti-reflective structured surface on photovoltaic modules or solar thermal panels operating in the field. In some embodiments, this method includes applying a silica nanoparticle coated anti-reflective structured surface film to the front surface of photovoltaic modules or solar thermal panels operating in the field. If the silica nanoparticle coating were to lose effectiveness while in operation due to wear (e.g., abrasion), application of the silica nanoparticle coating on the structured surface in the field would reinstate, for example, dirt repellency.

Additional details on embodiment's article in the present disclosure can be found in application having U.S. Ser. No. 61/390,524, filed Oct. 6, 1010, the disclosure of which is incorporated herein by reference.

Exemplary Embodiments
1. An article comprising a transparent substrate having an anti-reflective, structured surface and a sintered coating comprising a porous network of silica nanoparticles thereon, wherein the silica nanoparticles are bonded to adjacent silica nanoparticles, wherein the structured substrate further comprises a backing face, and a moisture barrier layer bonded to the backing face of the structured substrate.
2. The article of embodiment 1, wherein the porous network of silica nanoparticles is a three-dimensional network.
3. The article of either embodiment 1 or 2, wherein the sintered coating is a conformal coating relative to the anti-reflective, structured surface of a transparent substrate.
4. The article of any preceding embodiment, wherein the nanoparticles have a bi-modal size distribution.
5. The article of any preceding embodiment, wherein the nanoparticles have average particle diameters up to 400 nanometers.
6. The article of any preceding embodiment, wherein the nanoparticles have average particle diameters up to 300 nanometers.
7. The article of any preceding embodiment, wherein the nanoparticles have average particle diameters up to 200 nanometers.
8. The article of any preceding embodiment, wherein the nanoparticles have average particle diameters up to 150 nanometers.
9. The article of any preceding embodiment, wherein the nanoparticles have average particle diameters up to 100 nanometers.
10. The article of any preceding embodiment, wherein the nanoparticles have average particle diameters up to 75 nanometers.
11. The article of any preceding embodiment, wherein the nanoparticles have average particle diameters up to 50 nanometers.
12. The article of any preceding embodiment, wherein the nanoparticles have average particle diameters up to 40 nanometers.
13. The article of any preceding embodiment, wherein the nanoparticles have average particle diameters up to 30 nanometers.
14. The article of any preceding embodiment, wherein the nanoparticles have average particle diameters up to 20 nanometers.
15. The article of any preceding embodiment, wherein the nanoparticles have a bi-modal distribution.
16. The article of embodiment 15, wherein the bi-modal distribution of nanoparticles has a first distribution in a range from 2 nanometers to 15 nanometers and a second distribution in a range from 20 nanometers to 500 nanometers.
17. The article of embodiment 15, wherein the bi-modal distribution of nanoparticles has a first distribution in a range from 2 nanometers to 20 nanometers and a second distribution in a range from 30 nanometers to 500 nanometers.
18. The article of embodiment 15, wherein the bi-modal distribution of nanoparticles has a first distribution in a range from 5 nanometers to 15 nanometers and a second distribution in a range from 20 nanometers to 100 nanometers.
19. The article of any of embodiments 16 to 18, wherein the weight ratio of the first distribution of nanoparticles to the second distribution of nanoparticles is in a range from 1:99 to 99:1.
20. The article of any of embodiments 16 to 18, wherein the weight ratio of the first distribution of nanoparticles to the second distribution of nanoparticles is in a range from 10:90 to 90:10.
21. The article of any of embodiments 16 to 18, wherein the weight ratio of the first distribution of nanoparticles to the second distribution of nanoparticles is in a range from 20:80 to 80:20.
22. The article of any of embodiments 16 to 18, wherein the weight ratio of the first distribution of nanoparticles to the second distribution of nanoparticles is in a range from 30:70 to 70:30.
23. The article of any preceding embodiment, wherein the structured surface is a micro-structured surface.
24. The article of any preceding embodiment, wherein the surface structure comprises prisms.
25. The article of embodiment 24, wherein the prisms each comprise a prism tip angle in the range of from 15 degrees to 75 degrees and a pitch in the range of from 10 micrometers to 250 micrometers.
26. The article of embodiment 24, wherein the prisms each comprise an average slope angle in the range of from 15 degrees to 75 degrees and a pitch in the range of from 10 micrometers to 250 micrometers.
27. The article of any of embodiments 24 to 26, wherein the prisms have a trough to peak height in the range of from 10 micrometers to 250 micrometers.
28. The article of any preceding embodiment, wherein the surface structure has peaks and valleys and an average peak to valley height, wherein the sintered coating has an average thickness, and wherein the average thickness of the sintered coating is up to half of the average peak to valley height.
29. The article of any of embodiments 1 to 27, wherein the surface structure has peaks and valleys and an average peak to valley height, wherein the sintered coating has an average thickness, and wherein the average thickness of the sintered coating is less than 25 percent of the average peak to valley height.
30. The article of any preceding embodiment, wherein the sintered coating is a conformal coating relative to the anti-reflective, structured surface of a transparent substrate.
31. The article of any preceding embodiment, wherein the sintered coating has higher light transmission over a wider range of incident light angles than the surface structure itself
32. The article of any preceding embodiment, wherein the transparent substrate is a film.
33. The article of embodiment 32, wherein the film has a machine direction and wherein the surface structure comprises prisms that have linear grooves, parallel to the machine direction of the transparent film.
34. The article of either embodiment 32 or 33, wherein the anti-reflective, structured surface of the transparent film has structured faces anti-reflective to light, and wherein at least the anti-reflective structures comprise a polymer material.
35. The article of either embodiment 32 or 33, wherein the anti-reflective, structured surface of the transparent film has structured faces anti-reflective to light, and wherein at least the anti-reflective structures comprise a cross-linked polymer material.
36. The article of either embodiment 32 or 33, wherein the anti-reflective, structured surface of the transparent film has structured faces anti-reflective to light, wherein at least the anti-reflective structures comprises a cross-linked polymer material, and wherein the structured surface has a cross-link polymer density that is higher than a remainder of the film.

37. The article of embodiment 36, wherein the structured surface having a polymer cross-link density that is higher than a remainder of said anti-reflective structured film.

38. The article of either embodiment 36 or 37, wherein a core portion of each of the structures has a lower polymer cross-link density than that of the structured surface.

39. The article of any of embodiments 36 to 38, wherein the film further comprises a base portion from which the structures extend, all of the polymer elastomeric material of each of the structures has a polymer cross-link density about as high as that of the structured surface, and the base portion has a lower polymer cross-link density than that of each of the structures.

40. The article of embodiments 32 to 39, wherein the film exhibits a change in light transmission of less than 8%, after the structured surface is exposed to the Dirt Pick-Up Test.

41. The article of embodiments 32 to 40, wherein the film exhibits a change in light transmission of less than 8%, after said structured surface is exposed to the Falling Sand Test.

42. The device of any of embodiments 32 to 41, wherein the light absorbing device is a photovoltaic device comprising a photovoltaic cell that can be wound into at least one of a roll or folded without being damaged.

43. The device of embodiment 42, wherein the light absorbing device is a copper indium gallium selenide photovoltaic cell.

Foreseeable modifications and alterations of this disclosure will be apparent to those skilled in the art without departing from the scope and spirit of this invention. This invention should not be restricted to the embodiments that are set forth in this application for illustrative purposes.

What is claimed is:

1. An article comprising a transparent substrate having a polymeric anti-reflective, structured surface and an acid sintered coating comprising a porous network of silica nanoparticles thereon, wherein the silica nanoparticles are bonded to adjacent silica nanoparticles, wherein the structured substrate further comprises a backing face, and a moisture barrier layer bonded to the backing face of the structured substrate.

2. The article of claim 1, wherein the porous network of silica nanoparticles is a three-dimensional network.

3. The article of claim 1, wherein the acid sintered coating is a conformal coating relative to the anti-reflective, structured surface of the transparent substrate.

4. The article of claim 1, wherein the nanoparticles have average particle diameters up to 400 nanometers.

5. The article of claim 1, wherein the surface structure has peaks and valleys and an average peak to valley height, wherein the acid sintered coating has an average thickness, and wherein the average thickness of the acid sintered coating is up to half of the average peak to valley height.

6. The article of claim 1, wherein the nanoparticles have a bi-modal distribution.

7. The article of claim 6, wherein the bi-modal distribution of nanoparticles has a first distribution in a range from 2 nanometers to 15 nanometers and a second distribution in a range from 20 nanometers to 500 nanometers.

8. The article of claim 7, wherein a weight ratio of the first distribution of nanoparticles to the second distribution of nanoparticles is in a range from 1:99 to 99:1.

9. The article of claim 7, wherein a weight ratio of the first distribution of nanoparticles to the second distribution of nanoparticles is in a range from 10:90 to 90:10.

10. The article of claim 1, wherein the transparent substrate is a film.

11. The article of claim 10, wherein the film exhibits a change in light transmission of less than 8%, after the structured surface is tested by a dirt pick-up testing methodology.

12. The article of claim 10, wherein the film exhibits a change in light transmission of less than 8%, after said structured surface is tested by a falling sand testing methodology.

* * * * *